(12) United States Patent
DeVoe et al.

(10) Patent No.: US 8,885,146 B2
(45) Date of Patent: Nov. 11, 2014

(54) MULTI-PHOTON EXPOSURE SYSTEM

(71) Applicant: 3M Innovative Properties Company, St. Paul, MN (US)

(72) Inventors: Robert J. DeVoe, Mahtomedi, MN (US); Brian J. Gates, Osceola, WI (US); Dean Faklis, Springwater, NY (US); Robert T. Krasa, Hudson, WI (US); Przemyslaw P. Markowicz, Woodbury, MN (US); Craig R. Sykora, New Richmond, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/100,127

(22) Filed: Dec. 9, 2013

(65) Prior Publication Data

US 2014/0092372 A1 Apr. 3, 2014

Related U.S. Application Data

(62) Division of application No. 12/919,060, filed as application No. PCT/US2009/034287 on Feb. 17, 2009, now Pat. No. 8,605,256.

(60) Provisional application No. 61/031,538, filed on Feb. 26, 2008.

(51) Int. Cl.
    *G03B 27/54* (2006.01)
    *G03B 27/74* (2006.01)
    *G03F 7/20* (2006.01)

(52) U.S. Cl.
    CPC ............... *G03F 7/20* (2013.01); *G03F 7/2053* (2013.01); *G03F 7/70375* (2013.01); *G03F 7/70525* (2013.01); *G03F 7/7085* (2013.01)
    USPC .............................................. 355/67; 355/68

(58) Field of Classification Search
    CPC .............. G03F 7/2053; G03F 7/70525; G03F 7/70375; F03F 7/7085
    USPC ....................... 355/53, 67–69; 250/492.2, 548
    See application file for complete search history.

(56) References Cited

U.S. PATENT DOCUMENTS

| 3,018,262 | A | 1/1962 | Schroeder |
| 3,729,313 | A | 4/1973 | Smith |

(Continued)

FOREIGN PATENT DOCUMENTS

| EP | 841140 A2 | 5/1998 |
| EP | 856592 A1 | 8/1998 |

(Continued)

OTHER PUBLICATIONS

"Microlenslet Array Based Magnifying System," Shaoulov, Breault Research Organization, Inc., Tucson, AZ, USA, [on line], [retrieved from the internet on Feb. 7, 2011], URL <www.breault.com/resources/kbasePDF/wp_spie_026_microlenslet_array.pdf>, 8 pages. (date unknown but believed to be prior to the date of filing of the priority application).

(Continued)

*Primary Examiner* — Hung Henry Nguyen
(74) *Attorney, Agent, or Firm* — Yufeng Dong; Daniel J. Iden

(57) ABSTRACT

An exposure system includes a light source emitting a beam along an optical axis that is capable of inducing a multi-photon reaction in a resin. The exposure system further includes a resin undergoing multiphoton reaction, as well as an automated system including a monitor that measures at least one property of the beam selected from power, pulse length, shape, divergence, or position in a plane normal to the optical axis. The monitor generates at least one signal indicative of the property of the beam, and a sub-system adjusts the beam in response to the signal from the monitor.

2 Claims, 10 Drawing Sheets

(56) References Cited

U.S. PATENT DOCUMENTS

| | | | |
|---|---|---|---|
| 3,741,769 A | 6/1973 | Smith | |
| 3,779,778 A | 12/1973 | Smith | |
| 3,808,006 A | 4/1974 | Smith | |
| 4,249,011 A | 2/1981 | Wendling | |
| 4,250,053 A | 2/1981 | Smith | |
| 4,262,072 A | 4/1981 | Wendling | |
| 4,279,717 A | 7/1981 | Eckberg | |
| 4,394,403 A | 7/1983 | Smith | |
| 4,491,628 A | 1/1985 | Ito | |
| 4,642,126 A | 2/1987 | Zador | |
| 4,652,274 A | 3/1987 | Boettcher | |
| 4,668,601 A | 5/1987 | Kistner | |
| 4,859,572 A | 8/1989 | Farid | |
| 5,148,010 A | 9/1992 | Mori | |
| 5,235,015 A | 8/1993 | Ali | |
| 5,298,741 A | 3/1994 | Walt | |
| 5,369,511 A | 11/1994 | Amos | |
| 5,384,238 A | 1/1995 | Ellis | |
| 5,512,219 A | 4/1996 | Rowland | |
| 5,545,676 A | 8/1996 | Palazzotto | |
| 5,718,497 A | 2/1998 | Yokoyama | |
| 5,753,346 A | 5/1998 | Leir | |
| 5,770,737 A | 6/1998 | Reinhardt | |
| 5,801,666 A * | 9/1998 | MacFarlane | 345/6 |
| 5,856,373 A | 1/1999 | Kaisaki | |
| 5,858,624 A | 1/1999 | Chou | |
| 5,859,251 A | 1/1999 | Reinhardt | |
| 5,998,495 A | 12/1999 | Oxman | |
| 6,025,406 A | 2/2000 | Oxman | |
| 6,100,405 A | 8/2000 | Reinhardt | |
| 6,204,911 B1 | 3/2001 | Kurosawa et al. | |
| 6,215,095 B1 | 4/2001 | Partanen | |
| 6,262,140 B1 | 7/2001 | Savant | |
| 6,288,842 B1 | 9/2001 | Florczak | |
| 6,316,153 B1 | 11/2001 | Goodman | |
| 6,560,248 B1 | 5/2003 | Vernackt | |
| 6,674,572 B1 | 1/2004 | Scheruebl | |
| 6,696,157 B1 | 2/2004 | David | |
| 6,713,772 B2 | 3/2004 | Goodman | |
| 6,750,266 B2 | 6/2004 | Bentsen | |
| 6,804,062 B2 | 10/2004 | Atwater | |
| 6,852,766 B1 | 2/2005 | DeVoe | |
| 6,855,478 B2 | 2/2005 | DeVoe | |
| 6,949,272 B2 | 9/2005 | Wochnowski | |
| 7,026,103 B2 | 4/2006 | DeVoe | |
| 7,070,406 B2 | 7/2006 | Jeans | |
| 7,157,145 B2 | 1/2007 | Vissing | |
| 7,374,417 B2 | 5/2008 | Kuwabara | |
| 7,551,359 B2 | 6/2009 | Murnan | |
| 7,563,013 B2 | 7/2009 | Lin | |
| 7,583,444 B1 | 9/2009 | DeVoe | |
| 7,887,889 B2 | 2/2011 | David | |
| 7,893,410 B2 | 2/2011 | Sykora | |
| 8,109,665 B2 | 2/2012 | Lin | |
| 8,520,926 B2 * | 8/2013 | Schilling | 382/131 |
| 2002/0163619 A1 | 11/2002 | Matsuzawa | |
| 2002/0192569 A1 | 12/2002 | Ulland | |
| 2002/0197051 A1 | 12/2002 | Tamura | |
| 2003/0006535 A1 | 1/2003 | Hennessey | |
| 2003/0139484 A1 | 7/2003 | Bensten | |
| 2003/0155667 A1 | 8/2003 | Devoe | |
| 2003/0175525 A1 | 9/2003 | Wochnowski | |
| 2004/0067431 A1 | 4/2004 | Arney | |
| 2004/0145915 A1 | 7/2004 | Kim | |
| 2004/0180210 A1 | 9/2004 | Vissing | |
| 2004/0202865 A1 | 10/2004 | Homola | |
| 2004/0223385 A1 | 11/2004 | Fleming | |
| 2004/0228112 A1 | 11/2004 | Takata | |
| 2005/0054744 A1 | 3/2005 | DeVoe | |
| 2005/0079295 A1 | 4/2005 | Schaepkens | |
| 2005/0133954 A1 | 6/2005 | Homola | |
| 2005/0147918 A1 | 7/2005 | Weber | |
| 2005/0254035 A1 | 11/2005 | Frankel | |
| 2005/0271794 A1 | 12/2005 | DeSimone | |
| 2005/0272599 A1 | 12/2005 | Kramer | |
| 2005/0273146 A1 | 12/2005 | DeSimone | |
| 2005/0287771 A1 | 12/2005 | Seamons | |
| 2006/0046156 A1 | 3/2006 | Amako | |
| 2006/0051048 A1 | 3/2006 | Gardiner | |
| 2006/0072438 A1 * | 4/2006 | Nishino et al. | 369/275.1 |
| 2006/0157444 A1 | 7/2006 | Nakamura | |
| 2006/0226566 A1 | 10/2006 | Kwak | |
| 2006/0231728 A1 | 10/2006 | Takamatsu | |
| 2006/0254894 A1 | 11/2006 | Jung | |
| 2006/0279025 A1 | 12/2006 | Heidari | |
| 2007/0018362 A1 | 1/2007 | Heidari | |
| 2007/0035843 A1 | 2/2007 | Cassarly | |
| 2007/0057031 A1 | 3/2007 | Lee | |
| 2007/0090278 A1 | 4/2007 | Botma | |
| 2007/0102844 A1 | 5/2007 | Simon | |
| 2007/0216049 A1 | 9/2007 | Rudmann | |
| 2007/0217181 A1 | 9/2007 | Chiu | |
| 2007/0264481 A1 | 11/2007 | DeSimone | |
| 2007/0271791 A1 | 11/2007 | Lai | |
| 2008/0007964 A1 | 1/2008 | Lin | |
| 2008/0083886 A1 | 4/2008 | Faklis | |
| 2008/0106001 A1 | 5/2008 | Slafer | |
| 2008/0196664 A1 | 8/2008 | David | |
| 2008/0319404 A1 | 12/2008 | Pekurovsky | |
| 2009/0061039 A1 | 3/2009 | Zhang | |
| 2009/0099537 A1 | 4/2009 | DeVoe | |
| 2009/0163127 A1 | 6/2009 | David | |
| 2009/0175050 A1 | 7/2009 | Marttila | |
| 2009/0213466 A1 | 8/2009 | Murnan | |
| 2009/0250635 A1 | 10/2009 | Sykora | |
| 2009/0279321 A1 | 11/2009 | Marttila | |
| 2009/0284840 A1 | 11/2009 | DeVoe | |
| 2009/0285543 A1 | 11/2009 | Marttila | |
| 2010/0227272 A1 | 9/2010 | DeVoe | |
| 2010/0239783 A1 | 9/2010 | Mao | |
| 2010/0288614 A1 | 11/2010 | Ender | |
| 2010/0294954 A1 | 11/2010 | Gates | |
| 2010/0296106 A1 | 11/2010 | Gates | |
| 2010/0308497 A1 | 12/2010 | David | |
| 2010/0308509 A1 | 12/2010 | David | |
| 2010/0316959 A1 | 12/2010 | Gates | |
| 2011/0090142 A1 | 4/2011 | You | |

FOREIGN PATENT DOCUMENTS

| | | |
|---|---|---|
| JP | 60-160017 | 8/1985 |
| JP | 11-024081 | 1/1999 |
| JP | 2001-150451 | 6/2001 |
| JP | 2003-001599 A | 1/2003 |
| JP | 2004-009574 A | 1/2004 |
| KR | 10-2002-0088146 | 11/2002 |
| KR | 10-2007-0068852 | 7/2007 |
| WO | WO 98/21521 | 5/1998 |
| WO | WO 99/53242 A1 | 10/1999 |
| WO | WO 01/96915 | 12/2001 |
| WO | WO 01/96952 | 12/2001 |
| WO | WO 01/96958 | 12/2001 |
| WO | WO 01/96961 | 12/2001 |
| WO | WO 02/05972 A2 | 1/2002 |
| WO | WO 03/002269 A2 | 1/2003 |
| WO | WO 2005/101466 A2 | 10/2005 |
| WO | WO 2006/071914 | 7/2006 |
| WO | WO 2006/093963 A1 | 9/2006 |
| WO | WO 2007/051803 A1 | 5/2007 |
| WO | WO 2007/073482 A2 | 6/2007 |
| WO | WO 2007/137102 A2 | 11/2007 |

OTHER PUBLICATIONS

Allen, "193 nm Single Layer Positive Resists Building Etch Resistance into a High Resolution Imaging System", SPIE, 1995, vol. 2438, pp. 474-485.

Allen, "High Performance Acrylic Polymers for Chemically Amplified Photoresist Applications", J. Vac. Sci. Tech. B, Nov./Dec. 1991, vol. 9, No. 6, pp. 3357-3361.

Anderson, "Close-up Imaging of Documents and Displays with Lens Arrays", Appl. Opt., Feb. 15, 1979, vol. 18, No. 4, pp. 477-484.

Baldacchini and Fourkas, "Fabrication and Metallization of Three-

(56) References Cited

OTHER PUBLICATIONS dimensional Microstructures", Materials Research Society Symposium Proceedings, 2004, vol. EXS-2, pp. M10.1.1-M10.1.3.
Beck, "Improving Stamps for 10 nm Level Wafer Scale Nanoimprint Lithigraphy", Microelectr. Eng., 2002, vol. 61-62, pp. 441-448.
Beringer, "Diaryliodonium Salts, IX. The Synthesis of Substituted Diphenyliodonium Salts", J. Am. Chem. Soc., 1959, vol. 81, pp. 342-351.
Bongiovanni, "UV-curable Systems Containing Perfluoropolyether Structures: Synthesis and Characterization", Macromol. Chem. Phys., 1997, vol. 198, pp. 1893-1907.
Braun, "Polymer Replication of 3D Microstructures Employing a High Content Fluorine Separation Layer", Appl. Surf. Sci., 1999, vol. 138-139, pp. 206-211.
Chang, "A Roller Embossing Process for Rapid Fabrication of Microlens Arrays on Glass Substrates", Microsyst. Technol., Feb. 2006, vol. 12, pp. 754-759.
Dentinger, "Removal of SU-8 Photoresist for Thick Film Applications", Microelectronic Engineering, 2002, vol. 61-62, pp. 993-1000.
Duparre, "Artificial Compound Eyes—Different Concepts and Their Application to Ultra Flat Image Acquisition Sensors", MOEMS and Miniaturized Systems IV; Proceedings of SPIE, 2004, vol. 5346, pp. 89-100.
Duparre, "Microoptical Telescope Compound Eye", Optics Express, Feb. 7, 2005, vol. 13, No. 3, pp. 889-903.
Eaton, "Dye Sensitized Photopolymerization", Advances in Photochemistry, 1986, vol. 13, pp. 427-487.
Groning, "'Self-thickness-limited' Plasma Polymerization of an Ultrathin Antiadhesive Film", J. Vac. Sci. Tech. A., Nov./Dec. 1996, vol. 14, No. 6, pp. 3043-3048.
Hembd-Solner, "Imaging Properties of the Gabor Superlens", J. Opt. A: Pure Appl. Opt., 1999, vol. 1, pp. 94-102.
Hinsberg, "Effect of Resist Components on Image Spreading During Postexposure Bake of Chemically Amplified Resists", Advances in Resist Technology and Processing XVII; Proceedings of SPIE, 2000, vol. 3999, pp. 148-160.
Houle, "Antiadhesion Considerations for UV Nanoimprint Lithography", Applied Physics Letters, 2007, vol. 90, No. 213103, pp. 213103-1-213103-3.
Jaszewski, "Properties of Thin Anti-adhesive Films Used for the Replication of Microstructures in Polymers", Microelectr. Eng., 1997, vol. 35, pp. 381-384.
Jung, "Vapor-phase Self-Assembled Monolayer for Improved Mold Release in Nanoimprint Lithography", Langmuir, 2005, vol. 21, pp. 1158-1161.
Kim, "A Simple Fabrication Route to a Highly Transparent Superhydrophobic Surface with a Poly(dimethylsiloxane) Coated Flexible Mold", Chem. Commun., 2007, pp. 2237-2239.
Korner, "New Approaches in Depth-scanning Optical Metrology", Proc of SPIE, Apr. 1, 2004, vol. 5457, pp. 320-333, XP009084995.
Lafratta and Fourkas, "Direct Laser Patterning of Conductive Wires on Three-dimensional Polymeric Microstructures", Chem. Mater., 2006, vol. 18, pp. 2038-2042.
Large, "The Use of Electrochemical Potential Data in Studies of Spectral Sensitization", Photographic Sensitivity, R.J. Cox, ed., Academic Press, Chapter 15, pp. 241-264, (1973).
Lee, "Antiadhesion Surface Treatments of Molds for High-Resolution Unconventional Lithography", Adv. Mater., 2006, vol. 18, pp. 3115-3119.
Lee, Handbook of Epoxy Results (1967).
Lee, "Self-Assembled Monolayer as an Antiadhesion Layer on a Nickel Nanostamper in the Nanoreplication Process for Optoelectronic Applications", Applied Physics Letters, 2006, vol. 88, No. 073101, pp. 073101-1-073101-3.
Lel, "Local Thickness and Wave Velocity Measurement of Wavy Films with a Chromatic Confocal Imaging Method and a Fluorescence Intensity Technique", Experiments in Fluids, Nov. 1, 2005, vol. 39, pp. 856-864.
Li, "Multiphoton Polymerization", Materials Today, Jun. 2007, vol. 10, No. 6, pp. 30-37.
Maruo, "Three-dimensional Microfabrication with Two-photon-absorbed Photopolymerization," Opt. Lett., Jan. 15, 1997, vol. 22, No. 2, pp. 132-134.
Mann, Electrochemical Reactions in Nonaqueous Systems, (1970).
Moon, Ford, and Yang, "Fabricating Three-dimensional Polymeric Photonic Structures by Multi-beam Interference Lithography", Polymers for Advanced Technologies, Feb. 2006, vol. 17, No. 2, pp. 83-93.
Park, "Fabrication of Nano-precision PDMS Replica Using Two-photon Photopolymerization and Vacuum Pressure Difference Technique", Bull. Korean Chem. Soc., 2004, vol. 25, No. 8, pp. 1119-1120.
Peng, "High Fidelity Fabrication of Microlens Arrays by Nanoimprint Using Conformal Mold Duplication and Low-pressure Liquid Material Curing", J. Vac. Sci. Technol. B, Mar./Apr. 2007, vol. 25, No. 2, pp. 410-414.
Piestrup, "Large Area X-ray and Neutron Imaging Using Three-dimensional Arrays of Microlenses", Rev. of Sci. Inst., Nov. 2004, vol. 75, No. 11, pp. 4769-4774.
Shaoulov, "Compact Microlenslet-array-based Magnifier", Opt. Lett., Apr. 1, 2004, vol. 29, No. 7, pp. 709-711.
Shaoulov, "Magnifying Miniature Displays with Microlenslet Arrays", Helmet- and Head-Mounted Displays IX: Technologies and Applications; Proceedings of SPIE, 2004, vol. 5442, pp. 246-253.
Shi, "Chromatic Confocal Microscopy Using Supercontinuum Light", Optics Express, May 17, 2004, vol. 12, No. 10, pp. 2096-2101.
Smith, Modern Optical Engineering: The Design of Optical Systems, 1966, pp. 104-105.
Tanaka, Ishikawa and Kawata, "Two-photon-induced Reduction of Metal Ions for Fabricating Three-dimensional Electrically Conductive Metallic Microstructure", Appl. Phys. Lett., 2006, vol. 88, pp. 81107-1-81107-3.
Wang, "Polybenzoxazine as a Mold-release Agent for Nanoimprint Lithography", Langmuir, 2007, vol. 23, pp. 5868-5871.
Weinberg, Techniques of Chemistry, vol. 5, Part II, Technique of Electroorganic Synthesis, (1975).
Xu, "Measurement of Two-photon Excitation Cross Sections of Molecular Fluorophores with Data from 690 to 1050 nm", J. Opt. Soc. Am. B, Mar. 1996, vol. 13, No. 3, pp. 481-491.
Zhou, "An Efficient Two-photon-generated Photoacid Applied to Positive-tone 3D Microfabrication", Science, May 10, 2002, vol. 296, No. 5570, pp. 1106-1109.
International Search Report for PCT/US2009/034287, 3 pgs.
Written Opinion of the ISA for International Application No. PCT/US2009/034287, 3 pgs.
International Search Report for PCT/US2008/082588, 3 pgs.
Written Opinion of the ISA for International Application No. PCT/US2008/082588, 4 pgs.

* cited by examiner

MULTI-PHOTON EXPOSURE SYSTEM

CROSS-REFERENCE TO RELATED APPLICATIONS

This application is a divisional of application Ser. No. 12/919,060, filed on Aug. 24, 2010, and issued on Dec. 10, 2013, as U.S. Pat. No. 8,605,256, which is a national stage filing under 35 USC 371 of PCT/US2009/034287, filed on Feb. 17, 2009, which claims priority to U.S. Provisional Application No. 61/031,538, filed on Feb. 26, 2008, the disclosures of which are incorporated by reference in their entirety herein.

TECHNICAL FIELD

The invention relates to optical systems, and more particularly, to optical systems suitable for use in a multi-photon exposure process utilizing a photocurable material.

BACKGROUND

Multiphoton curing processes are described in U.S. Pat. No. 6,855,478. In these processes, a layer of a multiphoton curable photoreactive composition is applied on a substrate and selectively cured using a focused source of radiant energy, such as an ultrafast laser beam. A multiphoton curing technique may be used to fabricate two-dimensional (2D) and/or three-dimensional (3D) structures with micro- or nano-scale resolution.

Using a multiphoton curing technique, a 3D structure may be constructed voxel-by-voxel (3D volume element by 3D volume element) by controlling a location of the focus of the laser beam in three dimensions (i.e., x-axis, y-axis, and z-axis directions) within the photoreactive composition. In many cases, 3D structures are formed by curing approximately single voxel layers (e.g., in the x-y plane), followed by moving the focal point about one voxel length (e.g., in the z-axis), and curing a subsequent layer (e.g., in the x-y plane). This process may be repeated until the desired structure is at least partially cured.

SUMMARY

In one aspect, the present disclosure is directed to an exposure system including a light source emitting a beam along an optical axis. The beam is capable of inducing a multi-photon reaction in a resin. The exposure system further includes a resin undergoing multiphoton reaction, and an automated system. The automated system includes a monitor that measures at least one property of the beam selected from power, pulse length, shape, divergence, or position in a plane normal to the optical axis, and generates at least one signal indicative of the property of the beam. A sub-system adjusts the beam in response to the signal from the monitor.

In another aspect, the present disclosure is directed to an exposure system including a light source emitting a beam along an optical axis, wherein the beam is capable of inducing a multi-photon reaction in a resin. The exposure system further includes a resin undergoing multiphoton reaction, as well as an automated system that monitors a voxel shape within the resin. The automated system generates a signal indicative of the voxel shape, and adjusts the beam in response to the signal.

In yet another aspect, the present disclosure is directed to an exposure system including a light source emitting a beam along an optical axis, wherein the beam is capable of inducing a multi-photon reaction in a resin. The exposure system further includes a resin undergoing multiphoton reaction, and an automated system. The automated system includes means for monitoring a voxel shape within the resin, and means for adjusting the beam in response to a signal from the means for monitoring.

In yet another aspect, the present disclosure is directed to an exposure system including a light source emitting a beam substantially at a first wavelength along an optical axis, wherein the beam induces polymerization in a resin that is substantially optically transparent at the first wavelength. The exposure system further includes a first beam monitor system, wherein the first beam monitor systems monitors a first characteristic of the beam and generates a first signal. The first characteristic includes at least one of a power, a shape, and a position of the beam in a plane normal to the optical axis of the beam. The exposure system further includes a first divergence monitor system monitoring a divergence of the beam; a first divergence modulation system adjusting at least one of a divergence and a shape of the beam; and a first power control system adjusting a power of the beam at a first speed. The exposure system further includes a second monitor system, wherein the second monitor system monitors the first characteristic of the beam and generates a second signal, wherein the first and second signals are used to adjust the first characteristic. The exposure system further includes a first shutter transmitting or blocking the beam for controlling exposure of the resin; a third monitor system monitoring a position of a focal point of the beam along the optical axis; a second divergence modulation system adjusting at least one of a divergence and a shape of the beam; a first galvanometer system scanning the beam at a second speed not greater than the first speed, the scanning being along a first direction substantially normal to the optical axis; a second galvanometer system scanning the beam at a third speed not greater than the first speed, the scanning being along a second direction substantially normal to the optical axis and different from the first direction; an objective lens system for focusing the beam at a position within the resin; and a sample holding system for holding and positioning the resin and reducing the effects of at least one of temperature and vibration on the resin.

The details of one or more embodiments of the invention are set forth in the accompanying drawings and the description below. Other features, objects, and advantages of the invention will be apparent from the description and drawings, and from the claims.

DETAILED DESCRIPTION

In general, the disclosure is directed to an automated system capable of initiating a reaction in a multiphoton curable photoreactive composition. The automated system includes a number of optical components, including a monitor that measures a property of the beam and a sub-system that modifies a monitored property in response to a signal from the monitor. The optical components may be used alone or in combination to improve the accuracy and/or precision of the curing process. This enhanced accuracy makes possible the production of more precisely formed three-dimensional (3D) structures, particularly structures including complex shapes or micro- or nano-scale features. The automated system also makes possible production of the accurate structures with high throughput, which can be important for commercial use of multiphoton curing processes.

Figure 1:
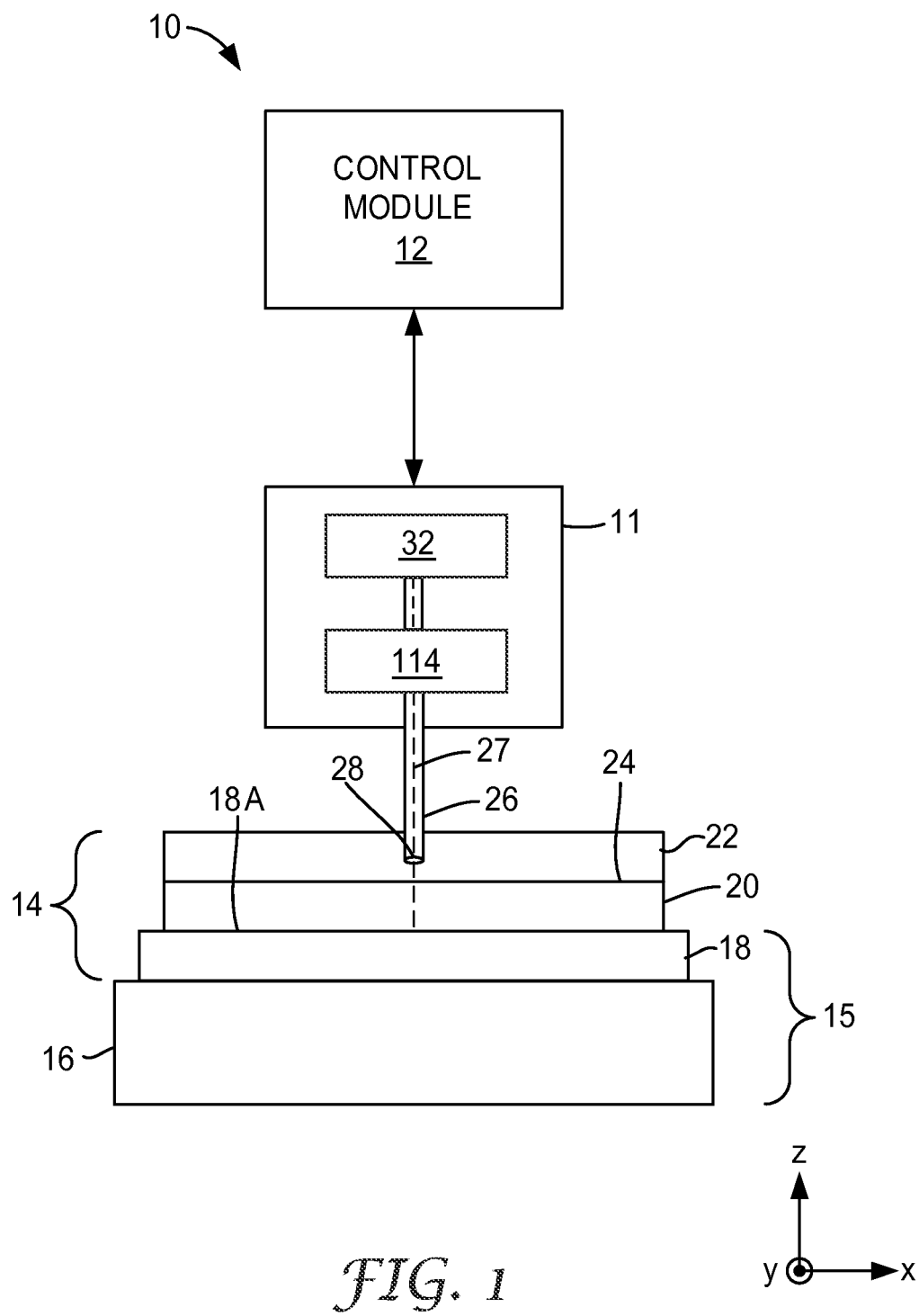
FIG. 1 is a block diagram illustrating an exposure system that may be used to fabricate an article, which preferably includes a plurality of microstructures or nanostructures.
Figure 2:
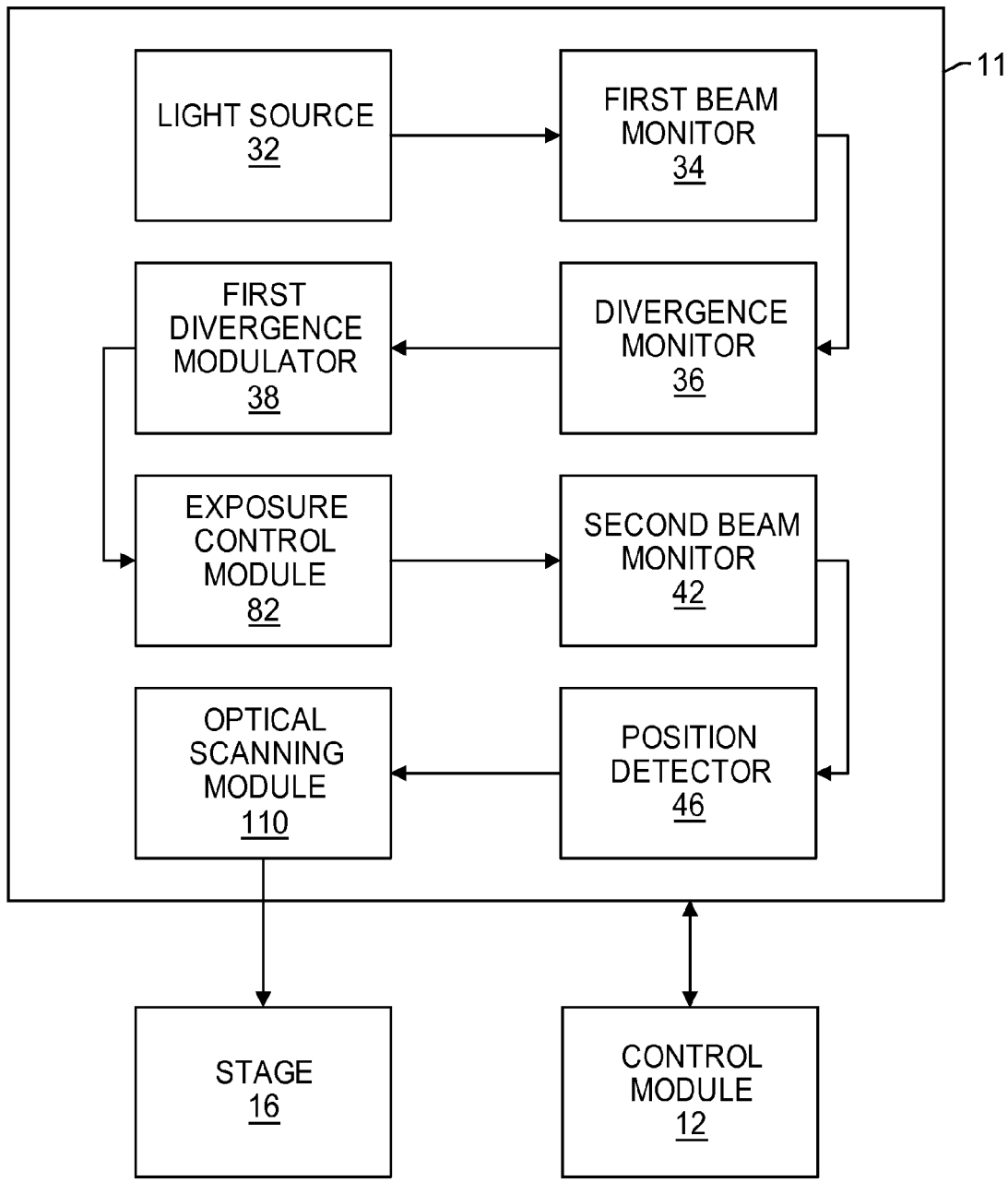
FIG. 2 is a schematic block diagram of an optical system.

FIG. 1 is a block diagram illustrating an exemplary automated exposure system that can be used to selectively initiate a reaction and/or at least partially cure a photoreactive composition and precisely define the features of an article. The exposure system 10 includes an optical system 11, and a block diagram illustrating further details of optical system 11 is shown in FIG. 2. Exposure system 10 also includes control module 12, a resin 22 including a multiphoton curable photoreactive composition, a substrate 20 on which resin 22 is placed, a chuck 18 to support the substrate 20, and a stage 16 that supports the chuck 18. Together, chuck 18 and stage 16 constitute a sample holding system 15 that holds and/or positions the sample (i.e., resin 22). In some embodiments, the holding system 15 can reduce the effects of at least one environmental factor (for example, temperature and/or vibration) on the curing process.

Optical system 11 is an optical imaging system including a light source 32 (see also FIG. 2) that provides a beam of radiation pulses 26 (hereinafter "beam 26"). The beam 26 is focused through a high numerical aperture objective lens (see also objective lens 114 of FIG. 8) onto an image plane 14. In FIG. 1, resin 22, substrate 20, and chuck 18 are positioned relative to the image plane 14 in the exposure system 10 to allow formation of a latent image or at least partial curing of the resin 22.

As described in further detail below, the automated optical system 11 may include modular functional elements that are selectively applied alone or in combination to maintain and/or enhance monitoring and control over the quality and positioning of a focal point 28 of one or more beams 26. In this application the term automated refers to a system that, following initial set up, applies the modular functional elements without human intervention to monitor and/or control the position of the focal point 28 of the one or more beams 26. The automated nature of the system makes it possible for the system to rapidly adjust the characteristics of the beam 26 (e.g., size, shape, power, pulse length, divergence and the like), as well as control the position of the focal point 28, to accurately and rapidly create the features of an article within resin 22. In some embodiments, the automated nature of the system makes it possible to adjust beam characteristics and/or position in less than about 1 second, in other embodiments these adjustments can be made in less than about 0.1 seconds, and in other embodiments these adjustments can be made in a time frame on the order of milliseconds. This rapid adjustment enhances the accuracy, the speed and the efficiency of article generation.

To create features within resin 22 with three dimensional resolution, the resin 22 may be substantially optically transparent to at least some of the wavelengths of the beam 26, preferably including the wavelengths of suitable energy to initiate single or multiphoton polymerization within resin 22.

For example, in a multiphoton polymerization process, when a pulse of sufficient intensity is present within resin 22, a nonlinear process occurs where two or more photons of radiation interact substantially simultaneously with resin 22. During the nonlinear interaction process, at least a portion of a photosensitizer component of the resin reaches an excited state, which induces a chemical reaction that can lead to formation of a latent image or at least partial cure of resin 22 proximate focal point 28, resulting in an at least partially cured voxel of material. Focal point 28 and resin 22 may be moved in at least one of the x-axis, y-axis or z-axis directions relative to each other, where orthogonal x-y-z axes are shown in FIG. 1 (the y-axis extends in a direction substantially perpendicular to the plane of the image shown in FIG. 1) to form multiple voxels within resin 22. The multiple voxels define the body of the article and/or specific micro or nano scale features on the article.

As described in further detail below, beam 26 may be moved along the x, y, and/or z axis directions relative to resin 22. Or, chuck 18, and thus substrate 20 and resin 22, may be moved along the x, y, and/or z axis directions relative to beam 26. In the alternative, both beam 26 and chuck 18 may be moved relative to each other to fabricate voxels at different positions within resin 22. In embodiments in which beam 26 is moved relative to resin 22, optical system 11 may help selectively position beam 26 within resin 22 to control the position of focal point 28 within resin 22 and selectively cure regions of resin 22 to define the features of an article. In some embodiments, focal point 28 may be scanned in one dimension (e.g., a x axis, a y axis, or a z axis). In other embodiments, the focal point 28 of beam 26 may be scanned in two dimensions (e.g., along the x-y axes, y-z axes or x-z axes). In yet other embodiments, the focal point 28 of the beam 26 may be scanned in three dimensions (e.g., along the x-y-z axes).

The resin 22 may vary widely depending on the intended application, and includes any suitable multiphoton curable photoreactive composition. For example, multiphoton curable photoreactive compositions may include a reactive species, a multiphoton photo sensitizer, an electron acceptor, and other optional components. Typical multiphoton exposable photoreactive compositions include at least one reactive species. The reactive species may be chosen based on a wide variety of properties, including high photosensitivity, minimal change in refractive index upon exposure to beam 26, strength and toughness of the at least partially cured resin 22, and the like.

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

The photoinitiator system may be a multiphoton photoinitiator system, as the use of such a system enables polymerization to be confined or limited to the focal region of a focused radiation beam 26. Such a system preferably is a two- or three-component system that includes at least one multiphoton photosensitizer, at least one photoinitiator (or electron acceptor), and, optionally, at least one electron donor. Such multi-component systems can provide enhanced sensitivity, thereby reducing the exposure required to effect photoreaction of the photoreactive composition. This allows exposure in a shorter period of time and reduces the likelihood of problems due to relative movement of the resin 22 and/or one or more components of the optical system 11.

Preferably, the multiphoton photoinitiator system includes photochemically effective amounts of (a) at least one multiphoton photosensitizer that is capable of simultaneously absorbing at least two photons and that preferably has a two-photon absorption cross-section greater than that of fluorescein; (b) optionally, at least one electron donor compound different from the multiphoton photosensitizer and capable of donating an electron to an electronic excited state of the photosensitizer; and (c) at least one photoinitiator that is capable of being photosensitized by accepting an electron from an electronic excited state of the photosensitizer, resulting in the formation of at least one free radical and/or acid.

Alternatively, the multiphoton photoinitiator system can be a one-component system that includes at least one photoinitiator. Photoinitiators useful as one-component multi-photon photoinitiator systems include acyl phosphine oxides (for example, those sold by Ciba under the trade designation Irgacure 819, as well as 2,4,6 trimethyl benzoyl ethoxyphenyl phosphine oxide sold by BASF Corporation under the trade designation Lucirin TPO-L) and stilbene derivatives with covalently attached sulfonium salt moieties (for example, those described by W. Zhou et al. in Science 296, 1106 (2002)). Other conventional ultraviolet (UV) photoinitiators such as benzil ketal can also be utilized, although their multiphoton photoinitiation sensitivities will generally be relatively low.

Multiphoton photosensitizers suitable for use in the multiphoton photoinitiator system of the resin 22 are those that are capable of simultaneously absorbing at least two photons when exposed to sufficient light. Preferably, the photosensitizers have a two-photon absorption cross-section greater than that of fluorescein (that is, greater than that of 3',6'-dihydroxyspiro[isobenzofuran-1(3H), 9'-(9H)xanthen]-3-one). Generally, the preferred cross-section can be greater than about $50 \times 10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18-22).

More preferably, the two-photon absorption cross-section of the photosensitizer is greater than about 1.5 times that of fluorescein (or, alternatively, greater than about $75 \times 10^{-50}$ cm$^4$ sec/photon, as measured by the above method); even more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the reactive species (if the reactive species is liquid) or is compatible with the reactive species and with any optional binders that are included in resin 22. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313.

Electron donor compounds useful in the multiphoton photoinitiator system of the photoreactive compositions are those compounds (other than the photosensitizer itself) that are capable of donating an electron to an electronic excited state of the photosensitizer. Such compounds may be used, optionally, to increase the multiphoton photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt versus a standard saturated calomel electrode ("S.C.E.").

The electron donor compound is also preferably soluble in the reactive species. Suitable donors are generally capable of increasing the speed of cure or the image density of a resin 22 upon exposure to a radiation beam 26 of the desired wavelength.

Suitable photoinitiators (that is, electron acceptor compounds) for the reactive species of the photoreactive compositions are those that are capable of being photosensitized by accepting an electron from an electronic excited state of the multiphoton photosensitizer, which forms at least one free radical and/or acid. Such photoinitiators include iodonium salts (for example, diaryliodonium salts), sulfonium salts (for example, triarylsulfonium salts optionally substituted with alkyl or alkoxy groups, and optionally having 2,2' oxy groups bridging adjacent aryl moieties), and the like, and mixtures thereof.

The photoinitiator is preferably soluble in the reactive species and is preferably shelf-stable (that is, does not spontaneously promote reaction of the reactive species when dissolved therein in the presence of the photosensitizer and the electron donor compound). Accordingly, selection of a particular photoinitiator can depend to some extent upon the particular reactive species, photosensitizer, and electron donor compound chosen, as described above. If the reactive species is capable of undergoing an acid-initiated chemical reaction, then the photoinitiator is an onium salt (for example, an iodonium or sulfonium salt).

Further details regarding suitable resins for use in multiphoton photopolymerization systems may be found, for example, in U.S. Patent Application Ser. No. 60/979,229, entitled "HIGHLY FUNCTIONAL MULTIPHOTON CURABLE REACTIVE SPECIES,".

The substrate 20, supported by the chuck 18, preferably supports resin 22. While reference is made to a substrate 20 supporting resin 22 throughout the present application, it is to be understood that in some embodiments, substrate 20 is not necessary, and resin 22 may be directly supported by chuck 18. Substrate 20 may be formed of any suitable material or combination of materials sufficient to support resin 22. Substrate 20 may be formed by any conventional process, including injection molding, compression molding, embossing, extrusion embossing, polymerizing within a mold, stamping, casting, machining, etching, sintering, grinding, chemical and physical deposition, crystallization, curing (including single- and multi-photon curing), and the like. In some embodiments, substrate 20 defines a substantially planar surface for supporting resin 22. In such embodiments, substrate 20 may include a silicon wafer, a glass plate, a machined substrate, or the like.

In yet other embodiments, substrate 20 may include a substantially non-planar surface. For example, substrate 20 may have a concave or convex curvature along one or more than one axis. For example, substrate 20 may be cylindrical, spherical, ellipsoidal, saddle-shaped, or the like. In some embodiments, substrate 20 may be a precision roll, such as those formed by diamond turning processes, polishing, or the like. In these embodiments, the surface of substrate 20 may be substantially smooth, or may include features, such as patterned features. In some preferred embodiments, substrate 20 is substantially smooth when substrate 20 has a curvature.

Substrate 20 may include surface irregularities such as peaks or valleys. In some embodiments, microstructured films, such as those formed from polyethylene terephthalate, polyimides, and the like, may make suitable substrates. Additionally, in some embodiments substrate 20 may have features including continuous or discontinuous patterns of depressions, protrusions, posts, channels, grooves, cavities, and the like. The features may be formed by any conventional method including, for example, laser writing, chemical etching, molding, and the like. Structures such as, for example, microelectromechanical systems (MEMS), may be formed by multiphoton initiated polymerization on or in the features on the substrate. Examples of adding structures to a feature may be found, for example, in U.S. Patent Application Publication No. 2003/0155667.

Substrate 20 may also include fiducial structures that enable the registration of the position of substrate 20 in the x-y axis, as will be described in further detail below. Fiducial structures may include continuous or non-continuous grooves, depressions, protrusions, or the like.

Substrate 20 may be held relative to chuck 18 using any suitable mechanism. In one embodiment, substrate 20 is held substantially stationary relative to chuck 18 with the aid of mechanical fasteners. Mechanical fasteners may include clips, screws, bolts, adhesives, and the like. Mechanical fasteners are preferably located in a plurality of locations with respect to substrate 20 to distribute the forces on substrate 20 and minimize or prevent unwanted deformation of substrate 20.

In another embodiment, substrate 20 is held substantially stationary relative to chuck 18 with the aid of vacuum pressure. Vacuum pressure may distribute the forces on substrate 20 more evenly than mechanical fasteners, and may thus cause less unwanted deformation of substrate 20.

Chuck 18 defines a surface that supports substrate 20. Thus, in many cases, the configuration of chuck 18 is selected to complement the configuration of substrate 20. For example, in the embodiment shown in FIG. 1, chuck 18 defines a substantially planar surface 18A for supporting substantially planar substrate 20. In other embodiments, substrate 20 may define a curved surface, in which case, chuck 18 may be shaped to support the curved surface of substrate 20. For example, substrate 20 may define a substantially cylindrical surface on which resin 22 is supported; in which case, chuck 18 may be shaped to support the cylindrical substrate 20. Alternatively, the configuration of substrate 20 may be selected to complement the configuration of chuck 18. For example, chuck 18 may include a surface mounted on rollers, or may include a lathe to rotate the substrate 20.

Chuck 18 may be fabricated from any one or more component materials, and may be fabricated from one or more suitable materials that provide an accurate, consistent location of the interface 24 of substrate 20 and resin 22 with a change in temperature. For example, chuck 18 may be fabricated from one or more materials that exhibit a relatively low coefficient of thermal expansion (CTE). Suitable materials for chuck 18 include, but are not limited to, granite, Perlumite, silicon carbide, and the like. A relatively low CTE is desirable for chuck 18 to maintain the substantially planar surface 18A on which substrate 20 rests and to provide a relatively small change of position of substrate 20 with respect to beam 26 with a change in temperature.

In some embodiments, chuck 18 is movable along at least one of the x-axis, y-axis, and z-axis directions. Chuck 18 may be supported on an air bearing surface (ABS) to reduce friction between chuck 18 and stage 16. Reducing friction between chuck 18 and stage 16 may help control module 12 move chuck 18 along the x-axis and y-axis directions with greater accuracy while requiring less energy. The ABS may be generated with any suitable source, such as compressed air, compressed nitrogen or a compressed inert gas.

Chuck 18 may be movable along at least one of the x-axis, y-axis, and z-axis direction with under power of a motor, for example. For example, in one preferred embodiment, a linear motor may be used to move the chuck 18 in a highly precise and accurate manner. In some embodiments, chuck 18 may also provide the capability to level substrate 20, for example by providing independent z-axis adjustment at a plurality of locations along chuck 18.

The stage 16 may also be fabricated from one or more suitable materials. In some embodiments, the stage 16 includes one or more materials with a relatively low CTE, such as, for example, granite. In other embodiments, the magnitude of the CTE is less important than the matching of CTEs throughout exposure system 10. Matching the CTEs of the various modules of exposure system 10 reduces the relative motion of the individual modules with respect to each other due to different amounts of thermal expansion or contraction, and may thus reduce the relative movement of resin 22 and beam 26. In yet other embodiments, chuck 18 and stage 16 may be passively or actively cooled using, for example, cooling fins, heat exchangers, or the like. Additionally, stage 16 may also be substantially isolated from the structure that supports stage 16 (e.g., a floor). Isolating stage 16 from the support structure may reduce the effect of vibrations of the support structure on resin 22. Isolation of stage 16 may be accomplished using materials such as polymer vibration isolation pads, for example.

Control module 12 may change a position of chuck 18 in the x-, y-, and/or z-axes to change the location of focal point 28 of beam 26 relative to resin 22. In some embodiments, however, at least one of the x-axis, y-axis, and z-axis positions of focal point 28 of beam 26 relative to resin 22 is modified with the aid of components of optical system 11.

Control module 12 generally controls optical system 11, and may also include one or more submodules. In one embodiment, control module 12 includes a processor, such as a microprocessor, a controller, a digital signal processor (DSP), an application specific integrated circuit (ASIC), a field programmable gate array (FPGA), discrete logic circuitry, or the like. In some embodiments, the processor may implement software, hardware, firmware or a combination thereof to control each of modules 32, 34, 36, 38, 82, 42, 46, and 110.

FIG. 2 is a block diagram of optical system 11 illustrating one embodiment of a configuration of modules 32, 34, 36, 38, 82, 42, 46, and 110, which together define an optical train. The order of the modules shown in FIG. 2 is merely exemplary, and is to be understood to not be limiting in any manner. In other embodiments, for example, second beam monitor 42 and position detector 46 may be in a different order, which may depend upon the dimensions, geometry or other considerations affected by the space into which optical system 11 is incorporated. The various modules 32, 34, 36, 38, 82, 42, 46, and 110 include both monitor systems that measure a property of beam 26 and sub-systems capable of modifying the measured property of beam 26. For example, the measured property may include at least one of power, pulse length, shape, wavelength, divergence, or position in a plane normal to the optical axis of the beam 26. Specific monitor systems and sub-systems capable of modifying a measured property of beam 26 will be discussed in further detail below.

Light source 32 emits a beam of radiation pulses 26 of sufficient intensity to initiate at least partial cure of resin 22. In some embodiments, the beam 26 may include a relatively narrow wavelength range, such as the nominal wavelength plus or minus about 5 nm, and may be said to be emitted substantially at a first wavelength. In some embodiments, such as those useful for multiphoton polymerization, the center wavelength of the emitted radiation pulses may be in the range from about 400 nm to about 2000 nm, preferably from about 500 nm to about 1000 nm, and more preferably from about 750 nm to about 850 nm. Light source 32 emits the radiation pulses along an optical axis 27 defined by the path of the beam 26 from the light source 32 to the resin 22. In embodiments in which optical system 11 is used in a multiphoton polymerization process, light source 32 emits a beam 26 that has sufficient power to cause multiphoton absorption at a wavelength appropriate for the multiphoton initiation system used in the photoreactive composition of resin 22. Light source 32 emits a beam 26 comprising the necessary peak power and intensity to initiate cure of resin 22. In some embodiments, light source 32 may emit a beam including an output pulse width of between about 1 femtosecond (fs) and about 10 ps, such as about 100 fs. In some other embodiments, light source 32 may emit a beam including an output pulse width of less than about 10 ns, preferably less than about 10 ps, and more preferably less than about 100 fs. In some cases, a high pulse repetition rate may be desirable. In some other embodiments, light source 32 may emit a beam including an output pulse repetition rate of greater than about 1 kHz or preferably greater than about 50 MHz.

In one embodiment, light source 32 is a relatively low power, ultrashort laser light, such as a pulsed femtosecond laser. As one example, light source 32 may include a Ti:sapphire laser, such as those available from Spectra-Physics under the trade designation MaiTai, commercially available from Newport Corporation of Irvine, Calif., or may include a fiber-based ultrafast laser.

In some embodiments, a voxel can be formed by a single laser pulse. In some other embodiments, formation of a voxel requires two or more pulses. In other embodiments, the multiple pulses may initiate cure of a plurality of voxels. A "low pulse energy" laser beam 26 refers to a beam of radiation pulses 26 exhibiting an insufficient power to fully cure a volume of resin 22. Rather, with a low pulse energy beam 26, the sequential pulses are necessary to fully cure a volume within resin 22.

In another embodiment, light source 32 is a high power continuous wave (CW) laser that does not require multiple pulses to initiate a full cure of resin 22. However, in some cases, it may be desirable to minimize the power of the laser beam 26 to minimize inadvertent heating of resin 22. Although it may be possible for the high power CW laser to initiate a full cure of a volume of resin 22 with a single pulse, the high power CW laser may also be used to sequentially cure a voxel in a stepwise fashion, which in some cases can provide a more accurate cure profile.

In some embodiments, a relatively low pulse energy laser, which emits a beam 26 that is insufficient to initiate cure of a volume of resin 22 without any optics, may be used in combination with optical elements. Focusing optics may increase the intensity of the beam 26 outputted from light source 32, thereby enabling the beam 26 emitted by low pulse energy light source 32 to cure resin 22. If desired, focusing optics may also be designed to decrease the intensity of the beam 26 outputted by light source 32. The combination of optical elements that are used to achieve the desired intensity beam 26 from light source 32 may be referred to as "pupil function synthesis." As described in further detail below, pupil function synthesis may focus the beam 26, impart a particular shape to the beam 26 at focal point 28, which may be desirable for controlling the size of the voxel formed within resin 22, or change the shape of the beam 26.

Light source 32 may emit a beam 26 having an inadvertently fluctuating power or trajectory. The power fluctuations may result in unstable positioning of focal point 28 of beam 26, which may adversely affect the ability of optical system 11 to precisely and accurately control the position of focal point 28 relative to resin 22. High or low frequency vibrations of one or more components of optical system 11 may also adversely affect the positioning of focal point 28. For example, vibrations from an air handling unit (e.g., for a heating, ventilation or air conditioning system) for the building in which system 10 is located may cause vibrations.

Figure 3:
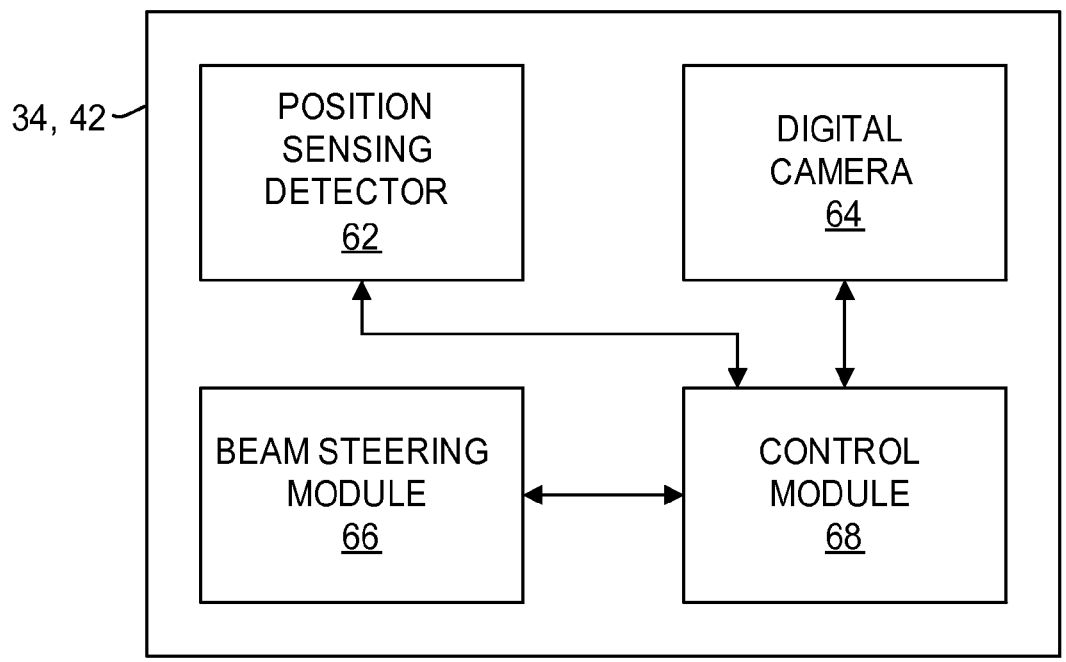
FIG. 3 is a schematic block diagram of beam monitor.

A first example monitor may include a first beam monitor 34 and/or a second beam monitor 42. Because of the high degree of control desired over the position of focal point 28 of beam 26, the position of the beam 26 may be sampled and controlled at one or more locations within optical system 11. At each of the locations, a beam monitor may be provided to measure at least one characteristic of the beam 26 and output a signal based on the at least one characteristic to a device, such as control module 12, that can control optical elements that affect the position, power and/or shape of the beam 26. In some embodiments, such as the embodiment illustrated in FIG. 2, optical system 11 includes a first beam monitor 34 and a second beam monitor 42 to provide position monitoring and correction of a first characteristic of the beam 26 at two locations in the optical system 11. Each of the first and second beam monitors 34, 42 may include a position sensing detector (PSD) 62, a digital camera 64, a beam steering module 66, and a control module 68, as shown in FIG. 3.

Control module 68, like control module 12 of exposure system 10, may include a processor, such as a microprocessor, DSP, an ASIC, a FPGA, discrete logic circuitry, or the like. The processor may implement software, hardware, firmware or a combination thereof to control each of detector 62, digital camera 64, and beam steering module 66. Although the embodiment of beam monitors 34, 42 shown in FIG. 3 includes control module 68 to control position sensing detector 62, digital camera 64, and beam steering module 66, in other embodiments control module 12 of exposure system 10 may provide the necessary control. Alternatively, control modules 12, 68 may be used in combination with each other.

To properly correct the position of focal point 28, first beam monitor 34 and second beam monitor 42 include a PSD 62 to measure the position of beam 26 at a relatively high speed. In some embodiments, the PSD 62 includes a quadrant detector, which includes four silicon chips that indicate the position of the beam 26 in the x-y plane (the plane normal to the optical axis 27) based on the voltage outputted by the silicon chips in each quadrant. The PSD 62 a signal to beam monitor controller 68, which uses the signal to control beam steering module 66.

The beam monitors 34, 42 may include a digital camera 64 in addition to a PSD 62 to provide beam 26 position information (in the plane normal to the optical axis 27) than the PSD 62. Digital camera 64 may also provide information relating to the size, shape, and/or power of the beam 26. Digital camera 64 may be any suitable camera that is sensitive to the wavelength of beam 26, such as, for example, a CCD or CMOS camera. Digital camera 64 may be used to determine information about beam 26 that is not critical to the feedback loop of the beam monitors 34, 42. For example, digital camera 64 may be useful for providing information that indicates the shape, size, and/or intensity regions of beam 26. If beam 26 does not provide the desired results (e.g., resin 22 is not cured as desired), feedback from digital camera 64 may be used to isolate the source of the problem.

Digital camera 64 may also be used in closed-loop feedback to change one or more characteristics of the beam 26. For example, the size or shape of the beam 26 monitored by digital camera 64 in each of first beam monitor 34 and second beam monitor 42 may be used by the divergence monitor 36 to determine whether an undesired divergence or astigmatism is present in beam 26. The divergence monitor 36 may then use this information to instruct first divergence modulator 38 to provide a correction to beam 26 to remove the unwanted divergence or astigmatism, as will be described in further detail below. In some embodiments, however, digital camera 64 may not be actively input into a control system, but the information provided by digital camera 64 may instead be used for later analysis of the operation of optical system 11.

Control module 68 receives beam 26 position information from position sensing detector 62 and digital camera 64, and controls a sub-system capably of modifying the position of beam 26, such as, for example, beam steering module 66 to reposition beam 26 based on the position information. Beam steering module 66 may include any optical elements useful for repositioning or redirecting beam 26, including, for example, lenses, mirrors, and the like. In one embodiment, beam steering module 66 includes at least one piezoelectric-actuated mirror that makes relatively high-speed corrections to the position of beam 26. The piezoelectric-actuated mirror may make corrections along one or two axes to reposition beam 26 substantially within the plane normal to the optical axis 27. As another example, beam steering module 66 may include two piezoelectric-actuated mirrors. The first of the two mirrors may make slow, but large magnitude movements to compensate for drift in beam 26 while the second mirror performs relatively faster corrections of small magnitudes to cancel out high frequency vibrations from optical system components. In other embodiments, any suitable number of mirrors may be used, or the mirror may be actuated by another system, such as a galvanometer.

In an alternative embodiment, the first and second beam monitors 34, 42 may be used to introduce a controlled amount of noise into the position of beam 26. This controlled amount of noise may serve to smooth the edges or surfaces of an at least partially cured structure formed in resin 22.

Light source 32 may emit a beam 26 that includes an astigmatism that results in a non-circular shape in a plane normal to the optical axis 27, as described briefly above. Light source 32 may also emit a beam 26 that include some amount of divergence, also described briefly above. Additionally, both the astigmatism and divergence of the beam 26 as emitted by light source 32 may vary over time. Accordingly, the optical system 11 may include a monitor system for monitoring astigmatism and divergence of beam 26. The divergence monitor 36 may monitor both the astigmatism and the divergence of beam 26. While divergence monitor 36 is illustrated in FIG. 2 as following the first beam monitor 34, divergence monitor 36 may be located at any point in the optical system 11. Additionally, in some embodiments, divergence monitor 36 may utilize the outputs of first and second beam monitors 34, 42 to determine any astigmatism or divergence present in beam 26.

In embodiments where the divergence monitor 36 is a discrete module, divergence monitor 36 may sample a small portion of beam 26 using, for example, a beam splitter, a beam sampling mirror, or the like while transmitting the majority of beam 26 through to the rest of optical system 11. In one embodiment, the small portion of beam 26 may be directed through an amplitude beam splitter that splits the beam 26 to form two beamlets. One of the beamlets travels a short path to a camera-based two-dimensional (2D) sensor, such as a CCD camera, while the other beamlet travels a longer path to the 2D sensor. If the two beamlets are not the same size as measured by the 2D sensor, the relative difference in size (e.g., a width or area) of the two beamlets determines amount of divergence of beam 26.

In another embodiment, divergence monitor 36 monitors the divergence of beam 26 using an interferometric approach. In the interferometric approach, the beam 26 interferes with itself, producing an equal optical path lateral shear (with a slight wedge) or rotational shear. The fringes produced allow for determination of the degree of collimation in a compact and simple configuration.

The divergence monitor 36 (e.g. a CCD camera) also measures a shape of the beam 26 in a plane normal to the optical axis 27. The shape of beam 26 indicates the presence or absence of astigmatism or ellipticity present in beam 26, which may result in a focal point 28 having an elliptical or other non-spherical shape. Depending on the intended application, astigmatism may or may not be desirable. For example, purposefully maintaining or introducing astigmatism into beam 26 may result in an elliptically shaped (or other non-circular shaped) beam 26 in a plane normal to the optical axis 27, which may more effectively or efficiently initiate cure of a selected voxel.

In other embodiments, divergence monitor 36 may use the output of the digital camera 64 of each of first and second beam monitor 34, 42 to determine a divergence and astigmatism of beam 26. For example, each digital camera 64 may monitor a size and shape of the beam 26 in a plane normal to the optical axis 27. Because each beam monitor 34, 42, and thus each digital camera 64, monitors a characteristic of the beam 26 at a different location within optical system 11, any change in the size or shape of the beam 26 as the beam 26 passes through optical system 11 may be detected by comparing the output of digital camera 64 of first beam monitor 34 with the output of digital camera 64 of second beam monitor 42. This comparison may be performed by divergence monitor 36, by control module 12, or by another control module, such as control module 68 of one of the beam monitors 34, 42.

Figure 4:
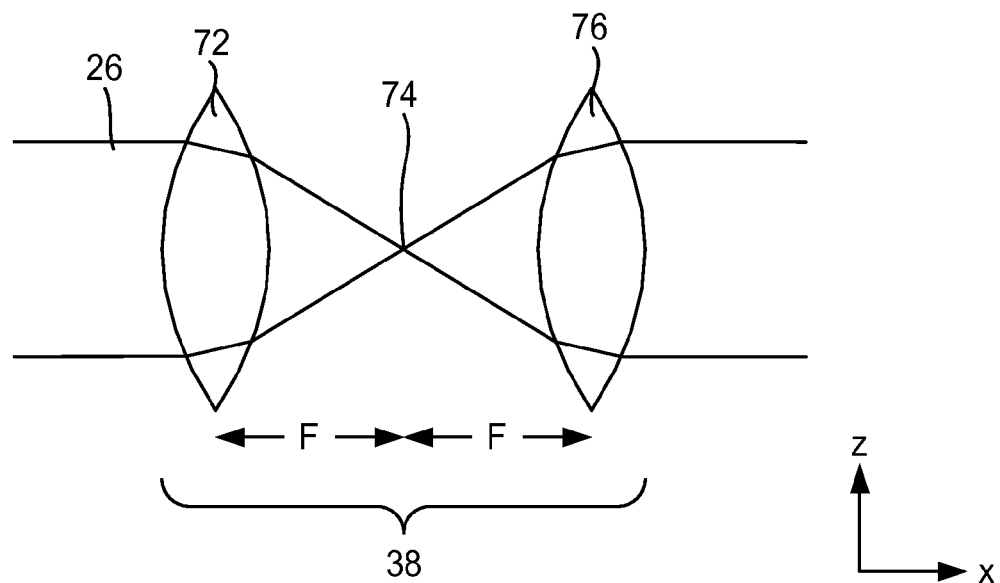
FIG. 4 is a diagram of a divergence modulation system.

The divergence and shape of the beam 26 as measured by divergence monitor 36 may be output to control module 12 or another control module (such as, for example, a control module dedicated to divergence monitor 36 and first divergence modulator 38) to determine whether any astigmatism or divergence correction is necessary. Control module 12 controls a sub-system capable of modifying a divergence or shape of beam 26, such as, for example, first divergence modulator 38 to provide any divergence or astigmatism correction necessary to beam 26. The first divergence modulator 38 may include two elements each having an optical power, such as, for example, two equal positive lenses 72, 76 spaced apart a distance of about two focal lengths F for approximately 1:1 expansion of the input beam 26, as shown in FIG. 4. Lens 72 may be mounted on a rotational stage that controls the rotational position of lens 72 to control astigmatism correction in response to any astigmatism measured by divergence monitor 36. Lens 74 may be mounted on a linear stage for controlling the position of lens 74 in the x-axis of FIG. 4. The linear stage may move lens 76 in the negative x-axis direction (to the left in FIG. 4) to increase the divergence of beam 26, or more lens 76 in the positive x-axis direction to decrease the divergence of beam 26 (i.e., increase the convergence of beam 26).

Figure 5:
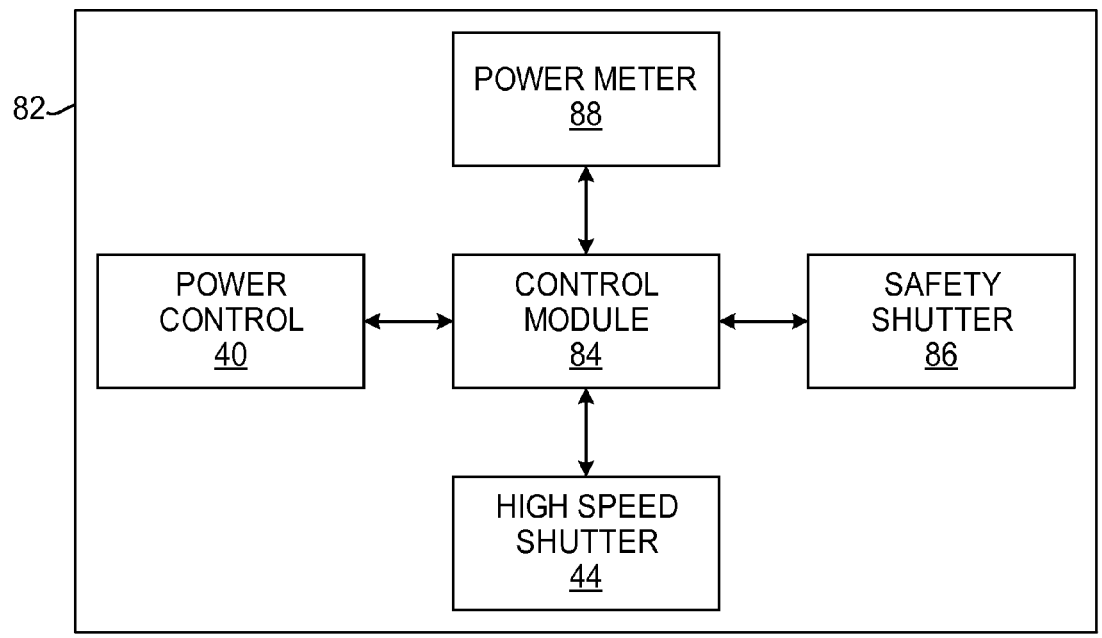
FIG. 5 is a block diagram of an exposure control module.

Optical system 11 further includes an exposure control module 82, which includes at least one monitor system and at least one sub-system capable of modifying a property of beam 26 to control exposure of resin 22 to beam 26. For example, in embodiment illustrated in FIG. 5, exposure control module 82 includes a control module 84, a safety shutter 86, a power meter 88, a power control 40 and a high speed shutter 44. Power control 40 controls the power of beam 26, and high speed shutter 44 initiates and terminates the exposure of resin 22 to beam 26 to selectively initiate cure of portions of resin 22 and create discreet 3D features or structures. In some embodiments, power control 40 and high speed shutter system 44 may include separate modules. As previously described, the process of curing resin 22 to form a voxel is substantially nonlinear, and any deviation from the desired laser power during the exposure process may create errors. Thus, it is important that power control 40 maintains the power of radiation beam 26 at a desired level or within a certain range of the desired level.

It is also preferable that both the power control 40 and high speed shutter 44 respond substantially as quickly or more quickly that any other component of optical system 11. For example, the first and second galvanometers 50, 52 are typically the fastest components in the optical system 11, so the power control 40 and high speed shutter 44 preferably respond at a speed substantially equal to or greater than the speed of the first and second galvanometers 50, 52.

In some embodiments, exposure control module 82 includes a safety shutter 86. Safety shutter 86 may be useful for providing controlled start-up and shut-down of optical system 11. As an example, safety shutter 86 may block beam 26 from exposing resin 22 while light source 32 is warming up, and may be closed while the remaining components of optical system 11 are shut down. In some types of laser beams, the laser warms-up prior to reaching a steady level of power. For example, the Spectra-Physics MaiTai laser may take between about five minutes to about 30 minutes to stabilize to a desired level for use in multiphoton curing processes. However, in some cases, safety shutter 86 may block beam 26 for a time sufficient to provide a beam 26 with a desired level of stability. During the warm-up period, beam 26 may undergo fluctuations in power and stability of beam trajectory (e.g., the predictability of the location of the focal point 28). Control module 84, or control module 12 of exposure system 10, may control safety shutter 86 to block beam 26 during the warm-up period, as well as at other times during which it is undesirable for the beam 26 to expose resin 22. For example, safety shutter 86 may be used as an emergency shut-off of optical system 11, in addition to or instead of turning off light source 32. In some embodiments, safety shutter 86 may also block beam 26 during calibration of beam 26.

Exposure control module 82 also includes high speed shutter system 44 that initiates and terminates exposure of beam 26 after beam 26 is substantially stabilized and resin 22 is in a desired position relative to focal point 28 of beam 26. Control module 84 within exposure control module 82 may control the shutter system. A "high" speed shutter system 44 may generally be any shutter system that may turn the beam 26 on or off at a speed above about one switch between an on/off stage per 1 millisecond. More preferably the high speed shutter system may turn the beam 26 on or off at a speed above 1 microsecond, and most preferably a speed greater than about 50 nanoseconds (50 ns), such as a speed of about one on/off cycle in about 20 ns.

In one embodiment, the high speed shutter system 54 includes a Pockels cell and a polarizer. In the Pockels cell, voltage is applied to a crystal(s) that may alter the polarization properties of a passing beam 26. In one type of high speed shutter, the Pockels cell is combined with a polarizer. The Pockels cell may be switched between a no optical rotation position (0°) and a generally 90° rotation to define a shutter than opens or closes in nanoseconds. In addition, the Pockels cell and polarizer combination may be rotated to a position between 0° and 90° to change the power of beam 26 before the resin 22 is exposed.

In another embodiment, high speed shutter system 44 includes an acousto-optic modulator (AOM), which uses the acousto-optic effect to diffract and shift the frequency of light using sound waves, such as radio-frequency sound waves. In one type of AOM, a piezoelectric transducer is attached to a material such as glass, and an oscillating electric signal vibrates the transducer, which creates sound waves in the glass. The sound waves change the index of refraction, which disperses the incoming beam 26 from light source 32. In some cases, however, such as when light source 32 incorporates a femtosecond laser, the optical dispersion of the beam 26 within the AOM may affect the optical precision of beam 26.

In yet other embodiments, high speed shutter system 54 may include mechanical switching devices, such as one or more mechanical shutters, a variable filter or etalon. The high speed shutter system 54 may also include a half-wave plate and polarizing beam splitter or a half-wave plate and polarizer, which will be described in further detail below with respect to power control 40. The Pockels cell, AOM, mechanical switching devices, and other high speed shutter systems may be used alone or in combination with each other.

Power meter 88 may monitor the power of beam 26 at a desired location within optical system 11. Additionally, in some embodiments, optical system 11 may include more than one power meter 88 to monitor the power of beam 26 in a plurality of locations within optical system 11. Power meter 88 may comprise, for example, a multimeter, which includes a silicon chip that outputs a voltage indicative of power. In some preferred embodiments, power meter 88 includes a National Institute of Standards and Technology (NIST)-traceable power meter.

In some embodiments, a beam sampler may reflect a portion of the beam 26. This reflected portion of beam 26 may be monitored by the power meter 88 to determine the power of the entire beam 26. Although only a portion of beam 26 is input into the power meter 88, power meter 88 or control module 84 may use an appropriate algorithm to estimate the power of the entire beam 26 based on a power measurement of the portion. Based on the power measurement, power meter 88 may provide feedback to control module 84, which may then adjust the power of beam 26 as necessary. For example, the power of beam 26 may be adjusted at light source 32 or by power control 40. In other embodiments, as described below, the power control 40 may include a beam splitter that directs a portion of beam 26 to power meter 88, while transmitting the remaining portion of beam 26 through the rest of the optical system 11.

Power control 40 may help correct any power variations in beam 26, or control the power of beam 26 to a desired level, prior to beam 26 exposing resin 22. With some radiation sources used by light source 32, even after beam 26 achieves a substantial equilibrium, beam 26 may exhibit variation in the output power. For example, the power variation may vary within a range of plus or minus one percent of the desired power output for beam 26. Such power variation may be undesirable when beam 26 is used to pattern relatively small-scale features, e.g., nanometer scale features, within resin 22.

Accordingly, power control 40 may adjust the power of beam 26 to the desired level. In some embodiments, the power control 40 includes a half-wave plate (HWP) and polarizing beam splitter (PBS) or a HWP and a polarizer to attenuate the light from light source 32. In some embodiments, power control 40 attenuates the light from light source 32 when light source 32 outputs a beam 26 that has a power greater than that desired to at least partially cure resin 22. Reducing the power of beam 26 helps to reduce the size of an at least partially cured voxel created by the exposure of a volume of resin 22 to focal point 28 of beam 26.

In some embodiments, incoming light (e.g., beam 26) directed at the PBS may be split into at least two portions by the PBS, where a first portion is directed by the PBS into the power meter 88, which may estimate the power of beam 26 based on the power of the first portion of beam 26, while another portion of beam 26 is directed by the PBS through the remaining portion of the optical system 11 towards the focal plane 14.

Figure 6:
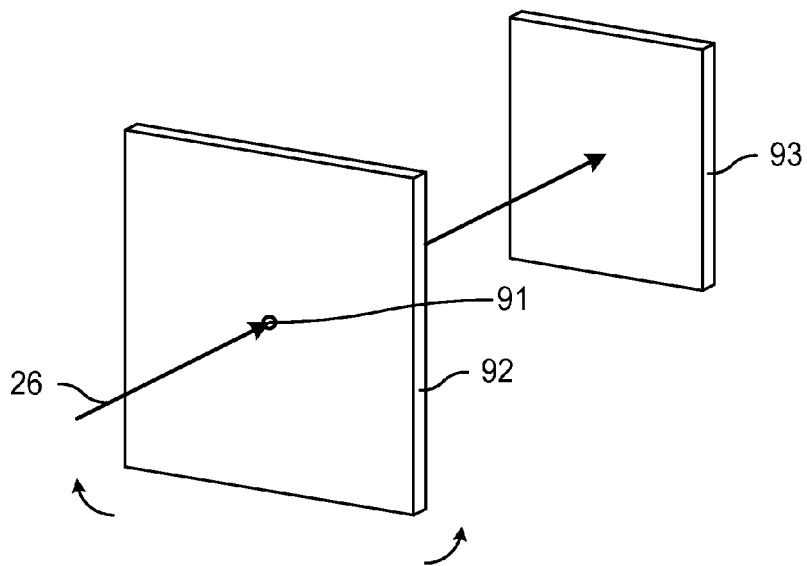
FIG. 6 is a schematic block diagram of a beam incident on a half-wave plate and a polarizer.

In one embodiment, as shown in FIG. 6, the HWP 92 is mounted for rotational movement, and a high-speed galvanometer motor rotates the HWP 92 under the control of control module 84 or another appropriate control module, such as control module 12 of fabrication system 10. In one embodiment, the HWP 92 may be rotated about 45° in each of the clockwise and counterclockwise directions about a central axis 91, for a total rotation of about 90°. As the HWP 92 is rotated a polarization component of the beam 26 is rotated. The beam 26 exits the HWP 92 and encounters a PBS 93. Depending on the polarization properties of beam 26, different amounts of beam 26 may be transmitted through PBS 93, thus changing the power of the beam 26. In some preferred embodiments, the portion of beam 26 reflected by the PBS 93 continues through the rest of optical system 11 and the transmitted portion of beam 26 is not used.

Figure 7:
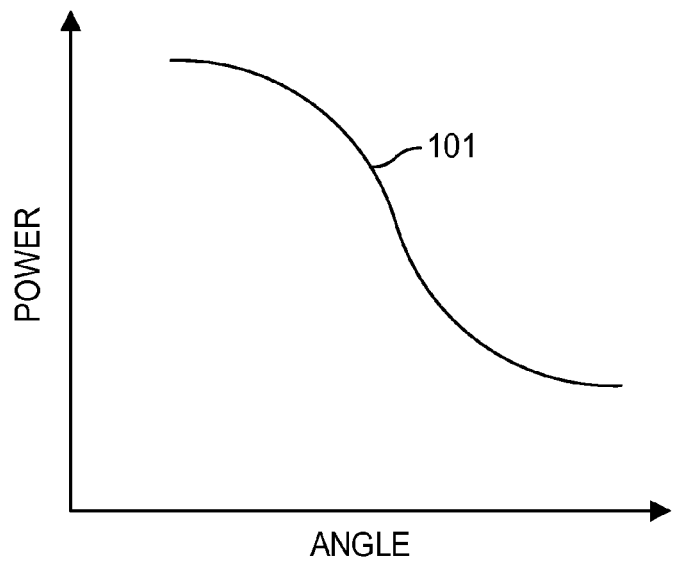
FIG. 7 is a graph of beam power versus angle of a half-wave plate.

The dependence of the power of beam 26 on the angle of HWP 92 may be experimentally determined and a corresponding curve 101 of power versus angle may be created, as shown in FIG. 7. While one type of potential curve 101 is shown in FIG. 7, other curves may be possible, such as, for example, linear curves, exponential curves, and the like. The experimentally-derived curve may be programmed into software and used to control the power of beam 26 by the rotation of HWP 92.

In general, the HWP 92 helps achieve a relatively high-speed power control such that the power of beam 26 for the voxel creation process may be changed substantially in real-time while creating one or more voxel within resin 22. The relatively high-speed power control enables the volume of an at least partially cured voxel to be varied substantially in real-time, as well.

For a given resin 22, voxel size may generally be thought of as a function of the amount of energy absorbed by a volume of resin 22. As a simplification, the total amount of energy absorbed by a volume of resin 22 may be approximately proportional to the amount of time a volume of resin 66 is exposed to focal point 28 of beam 26 multiplied by the power of beam 26. The relationship between the power of beam 26, scanning velocity of beam 26 (and thus time of exposure of a volume of resin 22), and the voxel size may be quite complex and may be linear or non-linear at different power/velocity combinations.

By experimentally determining the relationship between power/scan velocity and voxel size, a correlation may be provided to control module 84, or another suitable control module, that enables the control of optical system 11 to produce a voxel of a desired volume within resin 22 by varying the power of beam 26, the scan velocity of beam 26, or both. For example, to maintain a substantially constant voxel size when the scan velocity of beam 26 is decreased, the power of beam 26 may also be decreased by a necessary amount (e.g., an experimentally determined amount).

Alternatively, the combination of power and scan velocity of beam 26 may be chosen to provide a desired voxel size change. As one example, increasing the power at a given scan rate may result in a larger voxel size, which may be desirable for quickly curing a large volume of resin 22 with features of a limited resolution. In this example, the power may be lowered (while still maintaining an intensity above a threshold intensity) to create a smaller voxel, and thus higher resolution features, either before or after the curing of the large volume with limited resolution.

In another embodiment, a Pockels cell may also be used to provide real-time power control. For example, applying a prescribed voltage to a Pockels cell may result in a predetermined alteration of a polarization property of beam 26 passing through the Pockels cell. In this way, a Pockels cell may replace the HWP 92 and, in combination with a PBS 93, provide real-time power control of beam 26.

In yet other embodiments, the power control 40 and high speed shutter 44 may include the same components, such as a HWP 92 and PBS 93 that function as both a power control 40 and a high speed shutter 44. Then, the power may be controlled by controlling the rotation of HWP 92, and the high speed shutter 44 may be activate by rotating the HWP 92 to polarization orientation orthogonal to the polarizer 93 orientation.

The control module 84, or another control module, may control power control 40 to attenuate beam 26 and provide a beam 26 of the desired power based on the output of power meter 88, or another power meter, such as power detector 185, power detector 212, or power detector 213.

In other embodiments, exposure control module 82 may include other power and energy monitoring devices in addition to or instead of power meter 88. Furthermore, other power and energy monitoring devices may be incorporated into optical system 11 at specific steps or intervals and at various locations to set the desired power level or track the power levels or time with regards to specific optical components.

Optical system 11 may further include another monitor system, which is referred to hereinafter as a position detector 46. Position detector 46 monitors the position of the focal point 28 of beam 26 along the optical axis 27. Specifically, position detector 46 monitors the position of the focal point 28 with respect to the interface 24 between substrate 20 and resin 22. Locating and tracking the position of focal point 28 with respect to interface 24 is important in many embodiments, because variations in the interface 24 may be a substantial portion of the height of the structures formed in resin 22. Additionally, when structures are formed in resin 22 and not attached to the surface of substrate 20, any subsequent processing, such as solvent development to remove any unexposed portions of resin 22, may remove the structures from substrate 20.

Position detector 46 may include a wide range of detectors, including for example, capacitive sensors, interferometers, confocal sensors, and the like. A confocal sensor is generally preferred, such as the confocal sensor described in U.S. Patent Application Ser. No. 60/752,529, entitled, "METHOD AND APPARATUS FOR PROCESSING MULTIPHOTON CURABLE PHOTOREACTIVE COMPOSITIONS." A confocal sensor is a diagnostic device that detects the interface 24 between resin 22 and substrate 20 when interface 24 is located at or near the focus of the optical system 11. The focal point 28 of the optical system 11 is conjugate to a pinhole that only allows light that is retroreflected from interface 24 at the optical system 11 focus to pass through the pinhole. All other points are out of focus and are not detected. This apparatus accurately locates the interface 24 of resin 22 and substrate 20. Typically, optics and a high speed detector are located behind the pinhole. In some embodiments, the pinhole is replaced with a single- or multi-mode fiber, which behaves like a pinhole, except the light is guided to the high speed detector.

However, it is difficult to determine what side of interface 24 the focal point 28 is on if it is not located at interface 24. Thus, a chromatic confocal sensor may be utilized, such as those described in U.S. Patent Application Ser. No. 60/979,240, entitled "CHROMATIC CONFOCAL SENSOR." A chromatic confocal sensor may provide an improved range of detection of the focal point 28 with respect to interface 24 along the optical axis 27.

The confocal sensor may utilize either beam 26 or another interrogator beam, which preferably includes the wavelength or wavelength range of beam 26, to measure the location of the focal plane with respect to interface 24. When a confocal sensor is utilized to measure the location of the focal plane, the optical system 11 includes optical components that collect at least a portion of the beam (either beam 26 or a separate interrogator beam) that is retroreflected off of interface 24 and direct that portion to a spectrometer. The optical components may include, for example a polarizing beam splitter and an optical relay. The spectrometer then monitors the intensity, and optionally, the wavelength, of the retroreflected beam and uses this information to determine the location of focal point 28 with respect to interface 24. If an interrogator beam is utilized, it is preferable that the interrogator beam is directed through the objective lens 114 and includes the wavelength of beam 26 so that the focal point of the interrogator beam and beam 26 is substantially the same, thus simplifying the location of focal point 28 with respect to interface 24.

The position detector 46 may also be used to locate the substrate 20 in the plane substantially perpendicular to the optical axis 27 (the x-y plane in FIG. 1). As described above, the substrate 20 may include fiducial structures, such as grooves, depressions, protrusions, and the like. Because position detector 46, such as a confocal sensor, locates the focal plane with respect to the interface 24 of substrate 20 and resin 22, depressions or protrusions, if present, are easily located by a change in the signal output by the position detector. When the location of the depressions or protrusions with respect to the substrate 20 (in the x-y plane) is known, the location of the focal point 28 with respect to the substrate 20 in the x-y plane may accordingly be determined.

Figure 8:
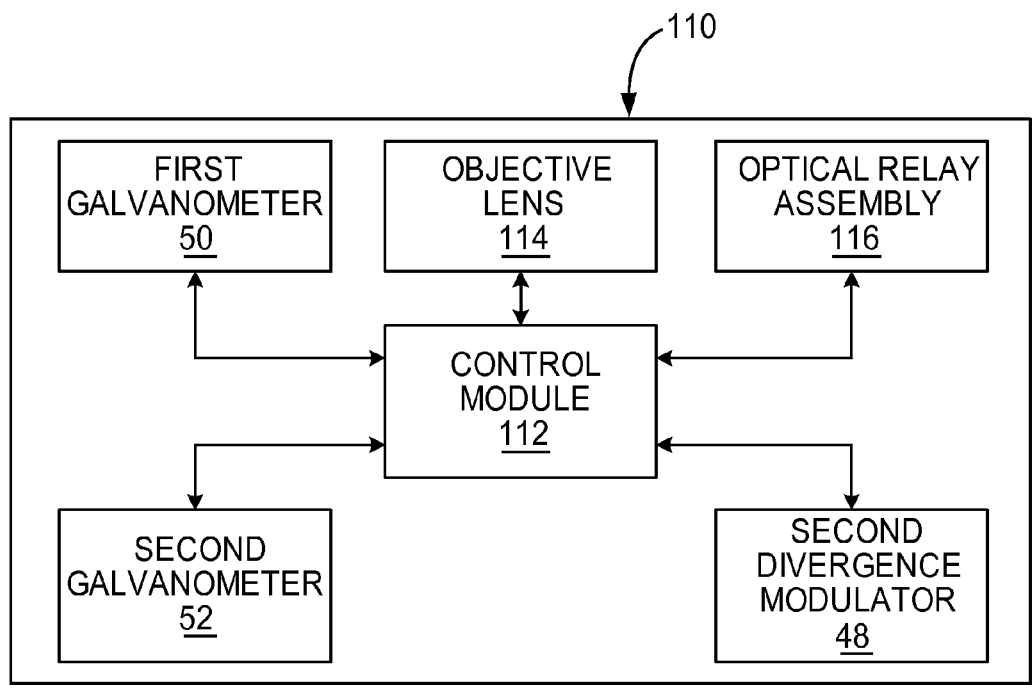
FIG. 8 is a block diagram of an optical scanning module.

FIG. 8 is a block diagram of optical scanning module 110, which includes sub-systems capable of modifying the position of beam 26, such as, for example, control module 112, objective lens 114, second divergence modulator 48, first and second galvanometers 50, 52, and optical relay assembly 116. Optical scanning module 110 directs beam 26 toward image plane 14 and focuses radiation onto image plane 14 with substantially submicron precision. In various embodiments, optical scanning module 110 directs and focuses beam 26 in one, two or three dimensions.

Control module 112, like control module 12 of exposure system 10, may include a processor, such as a microprocessor, DSP, an ASIC, a FPGA, discrete logic circuitry, or the like. The processor may implement software, hardware, firmware or a combination thereof to control objective lens 114, divergence modulator 48, and first and second galvanometers 50, 52. Although the embodiment of optical scanning module 110 shown in FIG. 8 includes control module 112, in other embodiments, control module 12 of exposure system 10 may provide the necessary control of objective lens 114, divergence modulator 48, and first and second galvanometers 50, 52. Alternatively, control modules 12, 112 may be used in combination with each other.

One sub-system capable of modifying the position of beam 26 includes objective lens 114, which focuses beam 26. Objective lens 114 comprises a numerical aperture (NA) that is sufficient (in combination with beam 26 as output by light source 32) to achieve the intensity necessary to cure resin 22, and, accordingly, the NA of objective lens 114 may differ depending upon the type of resin 22, as well as the size of the voxel to be defined in the at least partially cured resin 22. In one embodiment, objective lens 114 comprises a high NA objective lens, such as an NA in a range of about 1.0 to about 1.8. An "objective" lens may also be referred to as an "objective," a "positive" lens or a "focusing" lens. In some embodiments, objective lens 114 may include an immersion objective, such as an oil immersion objective, or an index matching fluid. The immersion objective may be included to prevent spherical aberration from occurring in beam 26 due to the refractive index mismatch of objective lens 114 and a dry air objective, for example. Objective lens 114 focuses focal spot 26 of beam 26 tightly into layer of resin 22 to achieve a threshold intensity to initiate cure of regions of layer of resin 22 that are exposed to the portions of beam 26 exhibiting at least the necessary threshold intensity (e.g., focal point 28). In one embodiment, objective lens 114 is a Nikon CFI Plan Fluoro 20× objective lens, which is available from Nikon Corporation of Tokyo, Japan. The Nikon 20× Multi Immersion Objective has a numeral aperture of 0.75 and a field of view of 1.1 millimeters (mm).

The front focal plane (i.e., the focal plane closest to resin 22) of objective lens 114 may be selected to align with various other optical elements of optical system 11, such as mirrors, a focus of an optical relay, or image plane 14. If a collimated beam pivots about the front focal plane in two dimensions, the focused beam will effectively "scan" as a telecentric imaging system across image plane 14 in two dimensions. In one embodiment, optical scanning module 110 is configured to pivot a collimated beam about the front focal plane of the objective lens 114, so as to achieve x-axis and y-axis positioning of beam 26.

Optical scanning module 110 further includes first and second galvanometers 50, 52, and one or more optical relay assembly 116, which includes one or more optical elements that relay an image to a virtual location, such as image plane 14. First and second galvanometers 50, 52, either alone or in combination with an optical relay assembly 116, comprise a sub-system capable of modifying the position of beam 26 in at least one direction in a plane normal to the optical axis. In one embodiment, the galvanometers 50, 52 may comprise mirrors mounted on a galvanometer that pivots or rotates the mirror in one or two dimensions. The image produced by optical relay assembly 116 may be considered an "internal" image. Optical relay assembly 116 may be useful in cases in which it is desirable to scan beam 26 in an x-axis, y-axis or z-axis direction, but the scanner (e.g., objective lens 114) does not physically fit within the desired space. Optical system 11 may be arranged such that the scanner may be placed in any suitable location, while maintaining the ability to scan beam 26 by relaying a scanned location of beam 26 to the desired location (e.g., image plane 14). While it is still possible for the scanner to scan beam 26 in one or more directions without the aid of optical relay assembly 116, it may be undesirable to do so from a relatively far distance because it may result in a curved image plane or aberrations in beam 26, which may be disadvantageous.

Figure 9:
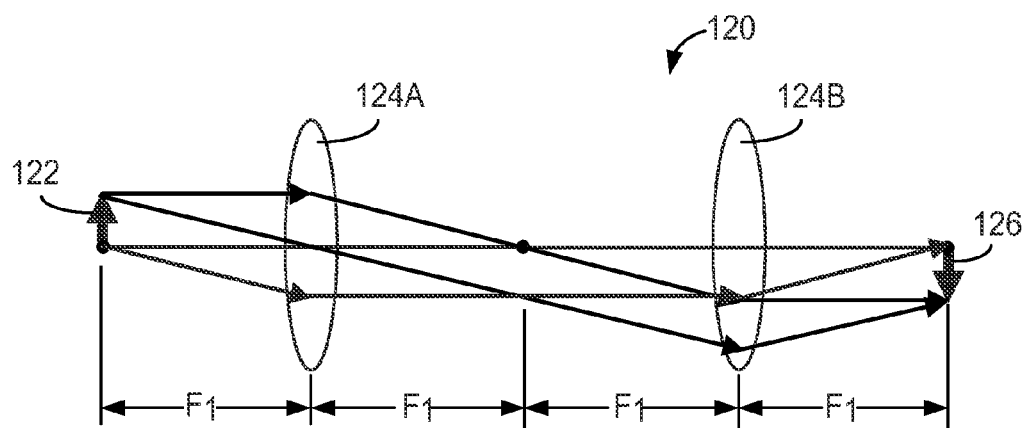
FIG. 9 is a schematic ray diagram of an optical relay.

A schematic ray diagram of one embodiment of a basic optical relay 120 is shown in FIG. 9. In some embodiments, optical relay 120 may be incorporated into optical relay assembly 116 of optical scanning module 110. In FIG. 9, optical relay 120 includes object 122, first lens 124A, second lens 124B that is substantially identical to lens 124A, and object 126. Objects 122 and 126 are images of objects. Lenses 124A and 124B each have a focal length F, and, as a result, objects 122 and 126 are separated by about four focal lengths $F_1$. Furthermore, because lenses 124A and 124B are substantially identical, optical relay assembly 116 provides a 1:1 magnification, such that objects 122 and 126 are substantially identical in size.

In other embodiments, other magnification ratios are possible. Furthermore, in other embodiments, other types of optical relays including a fewer or greater number of optical elements may be employed by optical scanning module 110. For example, in some embodiments, optical relay assembly 116 may be utilized with one or more galvanometers 50, 52 that tilt at various angles to scan beam 26 in one, two or three dimensions. A schematic ray diagram of one embodiment of a system 130 including two optical relays 134 and 140 and two galvanometers 50, 52 is shown in FIG. 10A.

System 130 includes galvanometer 50, optical relay 134 that includes lenses 136A and 136B, galvanometer 52, and optical relay 140 that includes lenses 242A and 242B. System 130 may be included within optical relay assembly 116 of FIG. 8. System 130 may be used to scan a collimated beam 26, or any other type of beam 26, within at least one dimension. In the embodiment shown in FIG. 10A, system 130 is configured to scan collimated beam 26 in the x-axis and y-axis directions (orthogonal x-z axes are show in FIG. 10A; the y-axis is oriented normal to the plane of FIG. 10A).

Figure 10A:
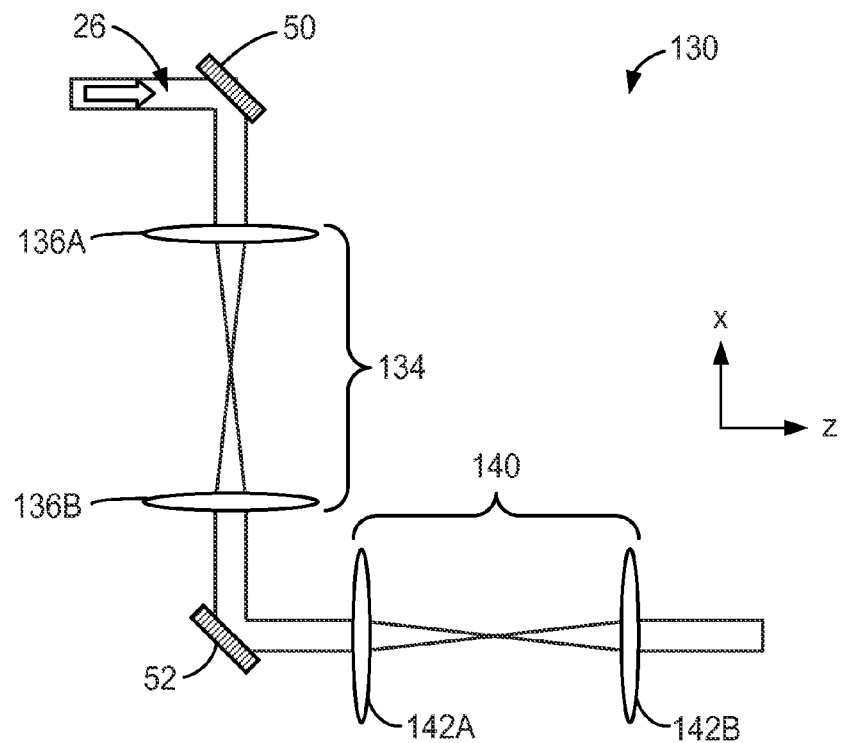
FIG. 10A is a schematic diagram of a system including two galvanometers and two optical relays.

As FIG. 10A illustrates, beam 26 is directed at galvanometer 50, which scans beam 26 in a substantially perpendicular direction, toward optical relay 134. After beam 26 passes through lenses 136A and 136B of optical relay 134, beam 26 projects onto galvanometer 52, which scans beam 26 in a substantially perpendicular direction, toward optical relay 140 and through lenses 142A and 142B of optical relay 140. Galvanometer 52 is positioned at the internal image of first optical relay 134, and in this way, the internal image of first optical relay 134 is also the object of second optical relay 140.

In general, control module 112 of optical scanning module 110 may control the orientation of first and second galvanometers 50, 52 to scan beam 26 in the x-axis and y-axis directions. The relative position beam 26 in the x-axis and y-axis directions may be mapped to the relative position of galvanometers 50, 52. Thus, a given position of each of galvanometers 50, 52 may correspond to a location of beam 26 in the x-axis and y-axis of the image plane 14. Control module 112 may control the position of each of first and second galvanometers 50, 52 based on the signals output by first and second beam monitors 34, 42, or based on chuck mounted PSD 214.

It has been found that in some embodiments, first and second galvanometers 50, 52 provide relatively fast and accurate scanning of beam 26, compared to some piezoelectric scanners and acousto-optic scanners. Fast scanning of beam 26 may help increase the speed with which structures are formed within resin 22. In one embodiment, first and second galvanometers 50, 52 may include dielectric coated beryllium mirrors rotated by a galvanometer. In some embodiments, it may be desirable that the speed at which beam 26 is scanned by galvanometers 50, 52 is less than the speed at which power control 40 adjusts the power of beam 26.

Figure 10B:
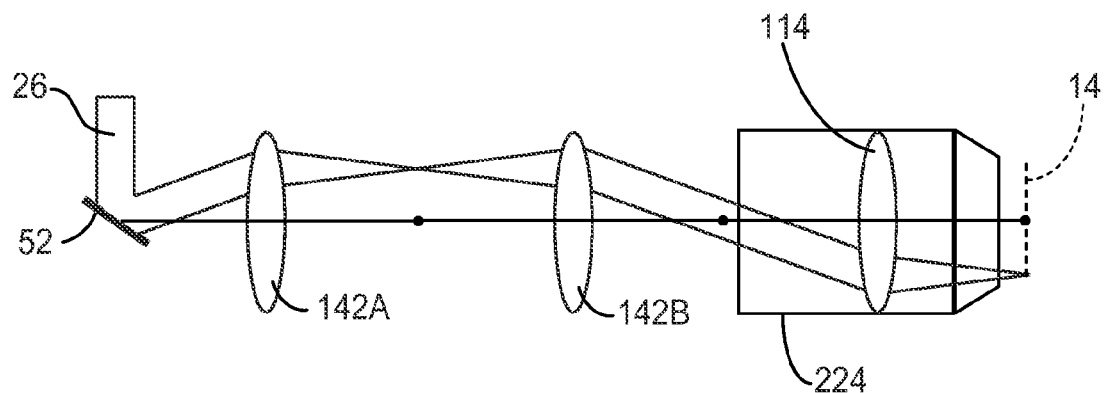
FIG. 10B is a schematic diagram of a system including an objective lens, an optical relay, and a galvanometer.

Objective lens 114 may be positioned such that its back focal plane is at the internal image of second relay 140, such that a focused beam is created at image plane 14. For example, as shown in FIG. 10B, objective lens 114 in housing 144 is positioned downstream of lens 142B of second optical relay 140, such that the internal image of beam 26 resulting from second optical relay 140 is focused through objective lens 114. Objective lens 114 focuses beam 26 onto image plane 14, and beam 26 may be scanned in at least two dimensions, such as along the x-axis direction and y-axis direction (substantially perpendicular to the plane of the image shown in FIG. 10B).

While optical relay assembly 116 and first and second galvanometers 50, 52 scans beam 26 in substantially along the x-y axes relative to image plane 14, optical scanning module 110 may further comprise a at least one sub-system capable of modifying the position of focal point 28 in the z-axis (orthogonal x-z axes are shown in FIG. 4), including, for example, second divergence modulator 48, objective lens 114, and chuck 18. Scanning focal point 28 of beam 26 substantially along the z-axis may help to achieve voxel positioning within resin 22 substantially along the optical axis 27 (the z-axis if FIG. 1). Although three techniques for scanning focal point 28 substantially along a z-axis direction are described below, any suitable technique may be employed. For example, in different embodiments, the techniques for scanning focal point 28 substantially along the optical axis 27 may employ mechanical devices, optical devices or a combination thereof.

In one embodiment, a motor or piezo-electric device translates objective lens 114 substantially along the z-axis direction to scan focal point 28 substantially along the optical axis 27. In some cases, scanning objective lens 114 in the optical axis 27 may affect the accuracy of beam 26 positioning in the x-y plane. Additionally, in some embodiments, a piezo-electric device provides a limited range of the position of focal point 28 in the optical axis 27, such as, for example, about 400 nm. However, translating objective lens 114 to scan focal point 28 of beam 26 substantially along the optical axis 27 may provide a relatively accurate positioning of beam 26 compared to other beam scanning techniques.

In another embodiment, rather than scanning focal point 28 of beam 26 substantially along the optical axis 27, exposure system 10 may include a mechanical assembly to move chuck 18 substantially along the z-axis direction. Moving chuck 18 to change the optical axis 27 positioning of focal point 28 within resin 22 enables optical system 11 to remain substantially in place. However, resin 22, substrate 20, and chuck 28 may constitute a relatively large mass to move, and therefore, moving chuck 18 may be a relatively slow process, which may decrease the throughput of exposure system 10. That is, in some cases, the weight of resin 22, substrate 20, and chuck 18 may adversely impact the speed at which exposure system 10 creates voxels within resin 22.

Figure 11:
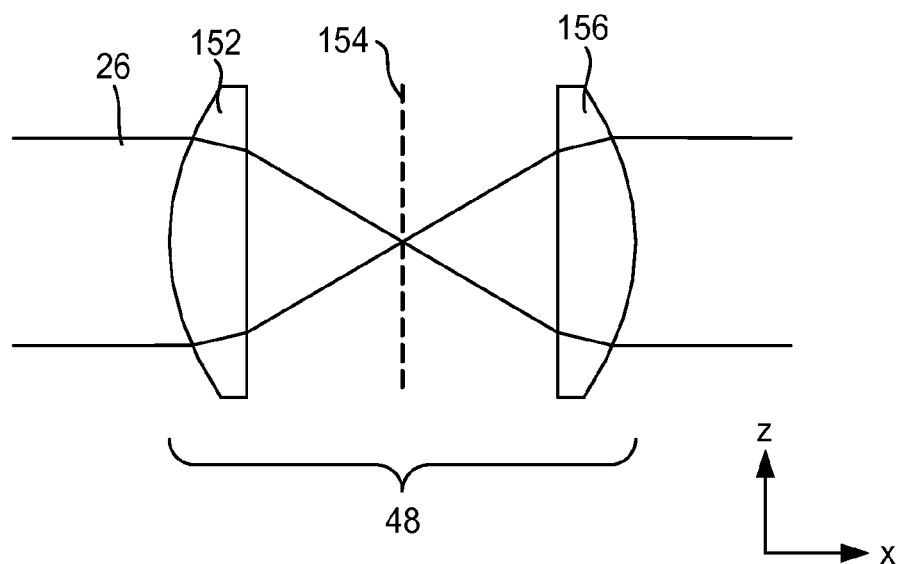
FIG. 11 is a diagram of a divergence modulator.

FIG. 11 is a schematic illustration of second divergence modulator 48, which may be used in a technique for scanning beam 26 substantially along the optical axis 27. Modulator 48 alters a divergence of beam 26 before beam 26 enters objective 54. Divergence modulator 48 may be, for example, an afocal telescope, such as, for example, a Keplerian telescope.

Divergence modulator 48 includes focusing lens assembly 152 and collimation optics 156. Focusing lens assembly 152 is configured to move along the x-axis (orthogonal x-z axes are shown in FIG. 11). As focusing lens 152 moves along the x-axis, the internal focus of beam 26 passes through the front focal plane 154 of collimation optics 156. When the internal focal point aligns with the front focal plane 154 of collimation optics 156, as is illustrated in FIG. 11, beam 26 emerges from collimation optics 156 collimated. When the internal focal point is located on the left side of front focal plane 154, the beam 26 is convergent as it emerges from divergence modulator 48, and beam 26 is more convergent when the internal focal point is further to the left of focal plane 154. Conversely, if the internal focal point is located to the right of focal plane 154, beam 26 emerges as a diverging wavefront.

An optical relay, such as optical relay 120 of FIG. 9 (not shown in FIG. 11) may reproduce the wavefront (i.e., beam 26) that emerges from collimation optics 156 and direct beam 26 toward objective lens 114. If beam 26 emerges from collimation optics 156 as a diverging wavefront, and the diverging wavefront enters objective lens 114, beam 26 will come to a focus further from objective lens 114 than the focal point of a collimated beam 26. On the other hand, if beam 26 emerges from collimation optics 156 as a converging wavefront, beam 26 will come to a focus closer to objective lens 114 than the focal point of a collimated beam 26. In this way, positioning of beam 26 along the optical axis 27 may be achieved by moving focusing lens assembly 152 of second divergence modulator 48. In some embodiments, focusing lens assembly 152 has a lower mass than objective lens 114 and chuck 18, thereby enabling focusing lens assembly 152 to be moved with a higher speed than moving objective lens 114 and/or chuck 18 with a comparable amount of power. The faster movement of focusing lens assembly 152 enables a higher speed positioning of focal point 28 within resin 22.

In embodiments using second divergence modulator 48 to control a position of beam 26 along the optical axis 27, objective lens 114 is preferably designed to handle a range of entering wave fronts, which can improve the quality of the voxels formed within resin 22.

In some embodiments, second divergence modulator 48 may introduce aberrations into beam 26. The aberrations may also be utilized to compensate for aberrations introduced near image plane 14. In some embodiments, an immersion objective may be used to compensate for aberrations introduced near image plane 14. However, in embodiments that simply use a dray air objective, spherical aberrations may exist when a voxel is formed at certain depths (measured along the z-axis direction) within resin 22. In such embodiments, the spherical aberrations may be actively compensated for with proper design of second divergence modulator 48, such as by introducing opposite amounts of spherical aberration in collimation optics 156. Compensating for aberrations may help form substantially high quality voxel at a wide range of depths within resin 22.

In some embodiments, it may be preferred to use two or more of the above-described methods to scan the focal point 28 of beam 26 substantially along the optical axis 27. For example, mechanical scanning on the objective lens 114 may be utilized along with the second divergence modulator 48 to provide enhanced positioning control of focal point 28 substantially along the optical axis 27, such as, for example, an extended range of optical axis 27 control.

Figure 12:
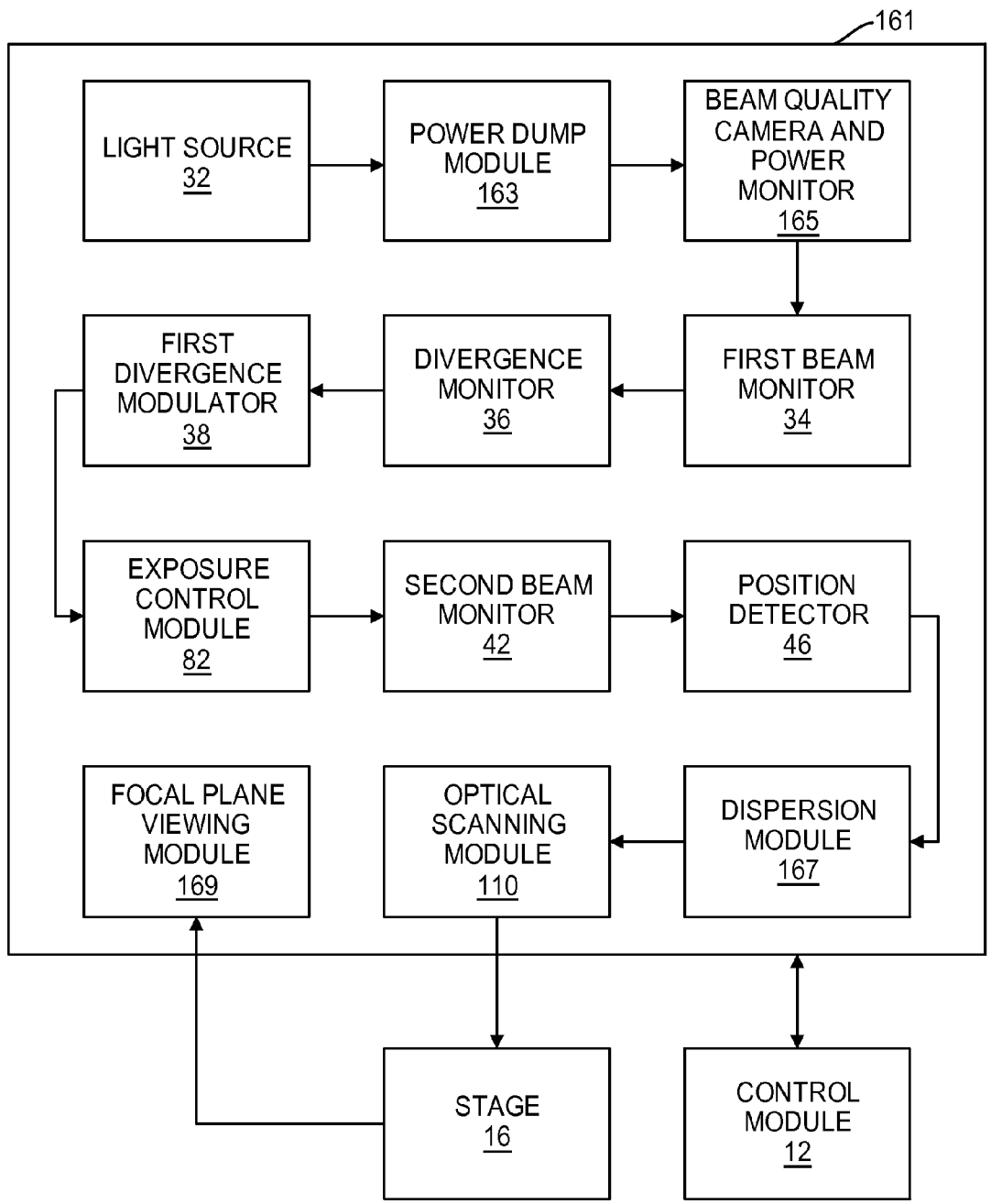
FIG. 12 is a block diagram of an optical system.

Optical system 11 may also include other, optional modules. Each of the optional modules will be described in further detail below, and FIG. 12 illustrates an optical system 161 including all of the optional modules.

Optical system 161 may include an optional power dump module 163 following the light source 32. The power dump module 163, as the name implies, is a sub-system capable of reducing the power of the beam 26 output from light source 32 to a desired level, such as, for example, a level that will not damage the subsequent optical components in the optical system 11, or approximately a level desired to initiate cure of resin 22. The power dump module 163 may not be necessary in all embodiments, such as those utilizing a light source 32 that emits a beam 26 of desired power for the intended application.

Figure 13:
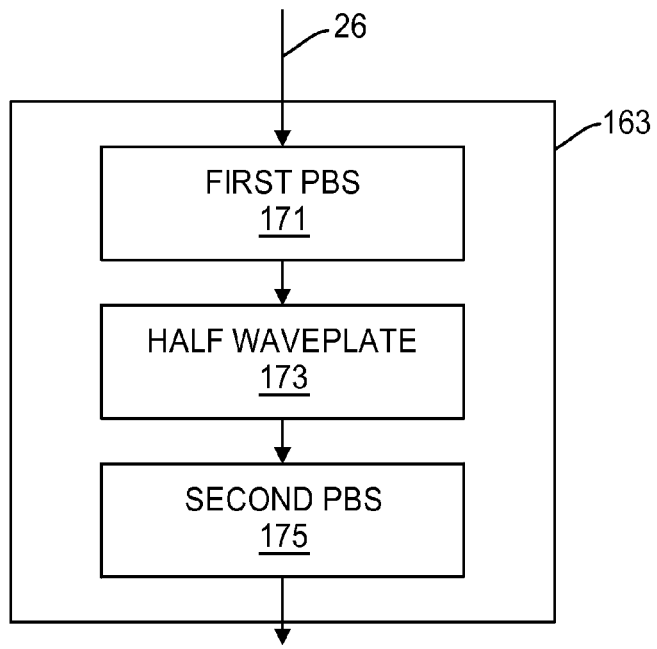
FIG. 13 is a schematic block diagram of a power dump module.

In one embodiment, illustrated in FIG. 13, the power dump module 163 includes a polarizing beam splitter (PBS) 171, an optional second PBS 175, and a half waveplate 173. A linearly polarized light beam 26 exits from the light source 32 and passes through the first PBS 171. The beam 26 then passes through a half waveplate 173 before encountering a second PBS 175. By controlling the rotation of the waveplate 173 with respect to the second PBS 175, the amount of beam 26 that is directed by the second PBS 175 to the subsequent components of the optical system 11 may be varied.

Figure 14:
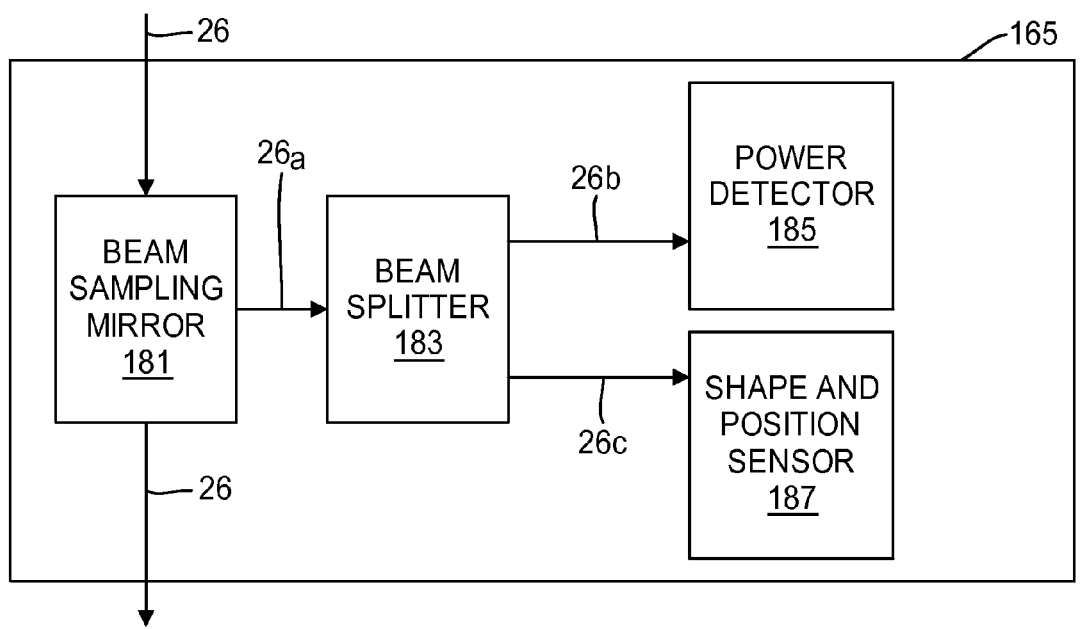
FIG. 14 is a schematic block diagram of a beam quality camera and power monitor.

Optical system 161 may further include another monitor system, referred to herein as beam quality camera and power monitor 165. The beam quality camera and power monitor 165 is used to monitor at least one of the power, shape or position of beam 26 at the location within optical system 11 from which beam 26 is sampled. The beam quality camera and power monitor 165, as shown in FIG. 14, includes a beam sampling mirror 181 that reflects a small fraction 26*a* of beam 26 and transmits the remainder of beam 26. The fraction 26*a* reflected by the beam sampling mirror 181 is routed through a beam splitter 183 that sends a first portion 26*b* of the small fraction 26*a* to a power detector 185 and a second portion 26*c* of the fraction 26*a* to a shape and position sensor 187 capable of detecting a shape and position of beam 26, such as, for example, a charge-coupled device (CCD), a CMOS-based camera, or another photodiode-based sensor. The power detector monitors the power of the first portion 26*b* of the beam 26 at this point in the optical system 161, and the shape and position sensor 187 monitors the shape and position of the second portion 26*c* of beam 26. Even though the power of only the first portion of beam 26 is monitored, the beam quality camera and power monitor module 165 may use algorithms to estimate the total power of beam 26 at this point in the optical system 161. In one preferred embodiment, the power detector is available from Newport Corp., Irvine, Calif., under the trade designation Newport 818 SL.

The power detector 185 and shape and position sensor 187 output signals based on the monitored power, shape and position of beam 26 which may be used by control module 12 to determine whether the power, shape, and position of beam 26 is within an acceptable range of the desired characteristics at this point in the optical system 161. The control module 12 may then control components of optical system 161 (e.g., first divergence modulator 38, power control 40, or the like) to produce a desired adjustment to one or more of the power, shape, and position of beam 26 in response to the signal output by the beam quality camera and power monitor module 165.

Figure 15:
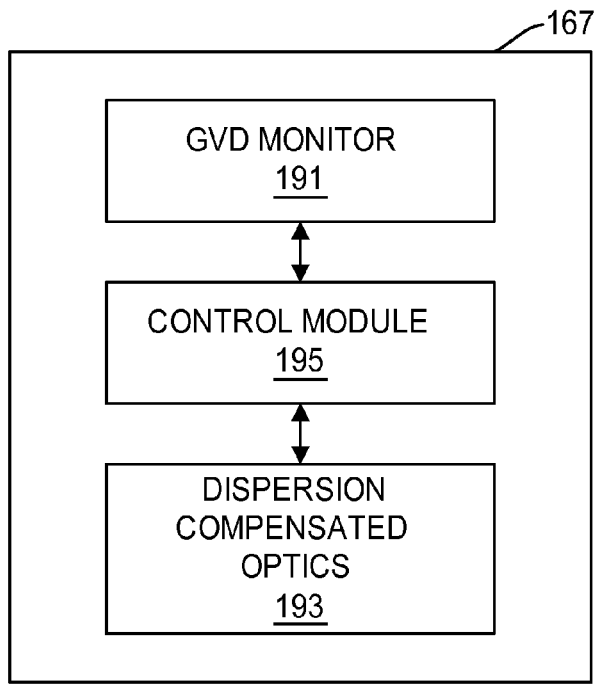
FIG. 15 is a schematic block diagram of a dispersion module.

The optical system 161 may further include a dispersion module 167 for monitoring and correcting any unwanted dispersion (i.e., widening of the pulse width) in beam 26. Dispersion module 167 may include a monitor system, group velocity dispersion (GVD) monitor 191, and a sub-system capable of modifying the dispersion of beam 26, which may include a control module 195 and dispersion compensated optics 193, as shown in FIG. 15.

The temporal characteristics of beam 26 generally affect the intensity of beam 26. For example, if light source 32 provides a femtosecond beam 26, group velocity dispersion (GVD) may result as beam 26 propagates toward image plane 14, which may decrease the peak intensity of beam 26, such that when beam 26 reaches resin 22, beam 26 no longer exhibits the sufficient threshold intensity to initiate cure of resin 22. A femtosecond pulse is typically composed of various frequencies that may cover a large bandwidth depending on the temporal pulse width. As these frequencies propagate through optical system 11, the longer wavelength (or "red") light travels faster than the shorter wavelength (or "blue") light. This may be referred to as GVD.

GVD has the effect of lengthening the pulse width in time, which may be an undesirable effect. GVD may be measured by dispersion module 167 using a GVD monitor 191. One common GVD monitor includes an autocorrelator. An autocorrelator takes an incoming pulse, splits it with an interferometer, and sends one portion along a variable delay path and the second portion along a set path length. The two portions are then sent through a crystal to create a nonlinear process known as second harmonic generation (SGH). The SGH light energy versus the variable time delay results in the measurement of the pulse width. However, autocorrelators possess disadvantages which limit their applicability in optical systems. Disadvantages include high sensitivity to alignment, assumptions made about the shape of the pulse that may limit details about the original pulse, and a lack of intensity or phase measurement. Because of these disadvantages, another type of GVD monitor 191, such as a Frequency-Resolved Optical Gating (FROG) or a Grating-eliminated no-nonsense observation of ultrafast incident laser light e-fields (GRENOUILLE) may monitor the dispersion of beam 26. FROG measures signal spectrum versus time delay rather than energy versus time delay. This allows the measurement to determine the pulse width, intensity, and relative phase of the pulse. However, FROG is more complex, and thus typically more expensive that a conventional autocorrelator. GRENOUILLE is a less complex FROG device that has no moving parts and is insensitive to alignment, and still measures full phase and intensity data of a pulse.

To correct for GVD, dispersion module 167 may precompensate or correct beam 26 using dispersion compensated optics 193, such as prisms, gratings (standard diffractive or fiber based), chirped coatings on mirrors or optical filters that modify the spectral phase of the beam, such as a Gires-Tournois interferometer or a specially designed cascaded chain of Mach-Zehnder interferometers, whereby the optics are composed such that the red light must take a longer optical path that the blue light through these dispersion compensated optics. In this manner, the blue light becomes sufficiently far ahead of the red light in time such that as all the colors pass through the remaining optical system 11, substantially all colors arrive at image plane 84 at the same time to maintain the ultrafast pulse width out of the femtosecond beam 90. The amount of pre-compensation or correction may be based on signals output by the GVD monitor 191 and may be controlled by control module 12 or another appropriate control module, such as a control module 195 dedicated to the dispersion module 167.

Some light sources 32 include controllable dispersion compensation features built into the light source 32 itself. In embodiments using these light sources 32, additional dispersion compensation optics may or may not be desired or necessary depending on the design and construction of optical system 11.

Control of the dispersion characteristics of beam 26 may also be used to control the power of beam 26. For example, by increasing the amount of dispersion of beam 26, the power of focal point 28 of beam 26 may be decreased. Conversely, by decreasing the amount of dispersion of beam 26, the power of focal point 28 of beam 26 may be increased. However, this method may not be preferred in some embodiments, because precisely controlling the dispersion of beam 26 may be difficult.

Optical system 161 may also include an optional focal plane viewing module 169 to monitor the pulsewidth and location of beam 26 after beam 26 leaves objective lens 114. The monitoring and control of the pulsewidth of the beam 26 is difficult to accomplish because there are few available devices that can detect a pulsewidth after the beam 26 passes through the final objective 114. The focal plane viewing module 169 allows for relative measurement of the pulsewidth of beam 26 by monitoring a material that fluoresces when exposed to beam 26. For example, assuming all other variables are constant, when a higher fluorescence is detected, it may be inferred that the pulsewidth is relatively shorter than when a lower fluorescence is detected, because a higher fluorescence implies a higher intensity of beam 26, which implies a shorter pulsewidth.

The focal plane viewing module 169 may also enable the tracking of the focal point 28 in the x-y plane (see FIG. 1). The fluorescence is confined substantially to the volume of resin 22 located at focal point 28 of beam 26, so any movement of focal point 28 produces a corresponding movement of the source of fluorescence within resin 22. Thus, by using a detector that has spatial resolution in the x-y axes, the position of the fluorescing portion of resin 22, and thus the focal point 28, may be tracked in the x-y axes.

One such suitable detector includes a quadrant detector, which in some embodiments includes four silicon chips that indicate the position of beam 26 in the x-y plane (the plane normal to the optical axis 27) based on the voltage outputted by the silicon chips in each quadrant. Another suitable detector may include an array of photodiodes.

The focal plane viewing module 169 may be inserted at many locations within the optical system 161, and may receive light fluorescing from resin 22 via, for example, a beam splitter, a beam sampling mirror or the like.

Figure 16:
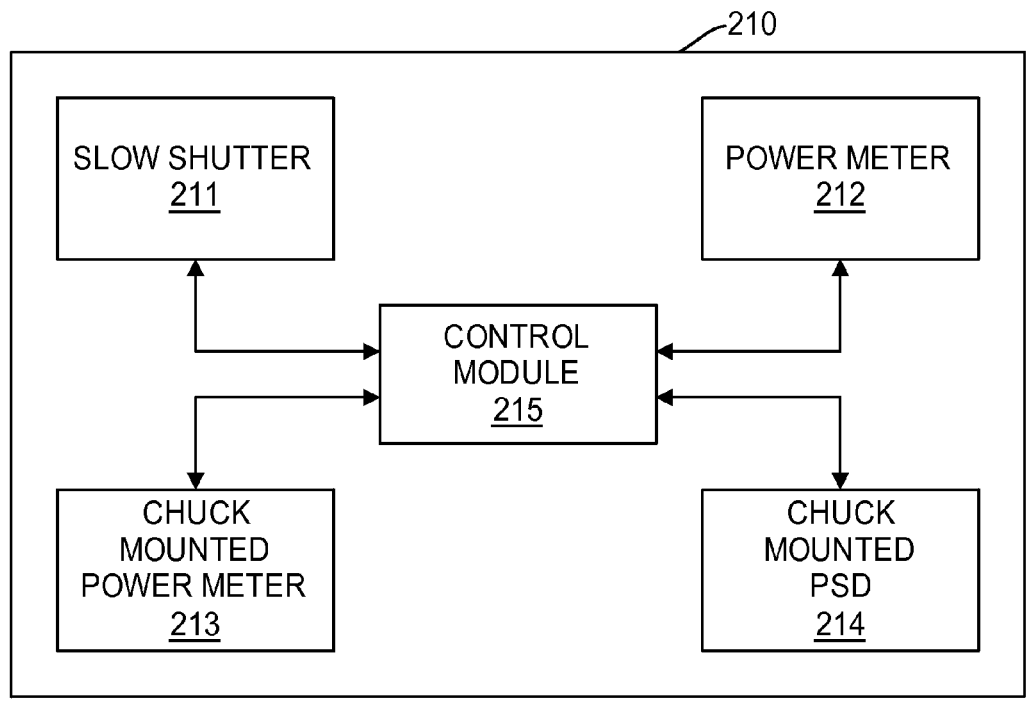
FIG. 16 is a block diagram of a calibration module.

It may also be necessary to calibrate both the beam 26 power and focal point 28 location within optical system 11, 161 (hereinafter "optical system 11"). Thus, exposure system 10 (FIG. 1) may include a calibration module 210, which is illustrated in FIG. 16. Calibration module 210 may include a number of sub-modules, including, for example, a slow shutter 211, a power meter 212, a chuck mounted power meter 213, a chuck mounted position sensing device (PSD) 214, and a control module 215. Control module 215 generally controls calibration module 210. In one embodiment, control module 215 includes a processor, such as a microprocessor, a controller, a digital signal processor (DSP), an application specific integrated circuit (ASIC), a field programmable gate array (FPGA), discrete logic circuitry, or the like. In some embodiments, the processor may implement software, hardware, firmware or a combination thereof to control slow shutter 211, power meter 212, chuck mounted power meter 213 and chuck mounted PSD 214. In other embodiments, calibration module 210 may not include a control module 215 and instead may be controlled by control module 12 of exposure system 10, or control modules 12, 215 may be used in combination to control calibration module 210.

One optical component that allows for calibration of both power of beam 26 and location of focal point 28 without exposing resin 22 to beam 26 includes a slow shutter 211. The slow shutter 211 may include a motor-driven mirror that may be moved from an open position to a closed position. In some embodiments, slow shutter 211 is slower than high-speed shutter 44, that is, slow shutter 211 may respond to an input more slowly than high-speed shutter 44. Slow shutter 211 may be positioned at any point within optical system 11, and in some embodiments, it may be preferred that slow shutter 211 is located at a point near the end of optical system 11 (e.g., as near to the final optical element of optical system 11 as possible). Positioning slow shutter 211 near the end of optical system 11 may allow measurement of a power of beam 26 that is more representative of the power of beam 26 at the image plane 14 than if slow shutter 211 is positioned near the beginning of optical system 11. This is because many optical elements may be expected to affect the power of beam 26, and thus, fewer optical elements between slow shutter 211 and the end of optical system 11 will result in less potential change in the power of beam 26 between slow shutter 211 and focal plane 14.

When the slow shutter 211 is in an open position, beam 26 is allowed to pass through the optical system 11 and expose resin 22 under control of the other optical components of optical system 11 (e.g., exposure control module 82 and the like). When the slow shutter 211 is in a closed position, slow shutter 211 redirects beam 26 to a power meter 212, which measures the power of beam 26. The power meter 212 may be any suitable power meter including, for example, a multimeter, which includes a silicon chip that outputs a voltage indicative of power. In some embodiments, the power meter 212 is a National Institute of Standards and Technology-traceable power meter.

The power meter 212 may send its output to control module 215. Control module 215 may use the output of the power meter 212 to calibrate the power of beam 26. For example, control module 215, or control module 12 of exposure system 10, may compare the outputs of power meter 212 and digital camera 64 or the power meter of power control 40. Control module 215 may perform the comparison at a single point and adjust the output of digital camera 64 or the power meter of power control 40 to match the output of power meter 212, or may perform the comparison at a plurality of output settings of light source 32 and generate a calibration curve that correlates the power indicated by digital camera 64 or the power meter of power control 40 to the power measured by power meter 215. This may allow more accurate measurement of the power of beam 26 at the various points in optical system 11 where digital camera 64 and/or the power meter of power control 40 are located and a more accurate comparison of the measure power values. Calibration of actual delivered power may improve the fidelity of articles formed in resin 22 using optical system 11 and may also help ensure repeatability and process consistency over time.

The slow shutter may also allow for the use of the position detector 46 to locate focal point 28 with respect to interface 24 without initiating cure of resin 22. For example, the slow shutter may be located in a position within optical system 11 such that beam 26 is prevented from impinging on resin 22 when the slow shutter is closed, while an interrogator beam is allowed to interrogate and locate the interface 24 of substrate 20 and resin 22.

The system calibration module 210 may also include modules mounted on chuck 18 to calibrate the position and power of focal point 28 and beam 26 after beam 26 exits objective lens 114. Specifically, in the illustrated embodiment, chuck mounted power meter 213 and chuck mounted PSD 214 are mounted on chuck 18 to provide information regarding beam 26 at the focal plane 14. Power meter 213 and PSD 214 may be mounted at any useful location of chuck 18 within the field of view of objective lens 114. That is, power meter 213 and PSD 214 may be mounted at any location of chuck 18 onto which objective lens 114 may focus beam 26.

Calibrating the power and position of beam 26 and focal point 28 at the image plane 14 allows the effects of the entire optical system 11 to be taken into account. Thus, calibrating the power and position of beam 26 and focal point 28 at the focal plane 14 may provide more accurate calibration than calibration using slow shutter 211 and power meter 212.

Similar to power meter 212, power meter 213 may include a NIST-traceable power meter such as, for example, a multimeter. The multimeter may be mounted directly on chuck 18, or a collecting lens, which directs beam 26 to the multimeter, may be mounted on chuck 18. The multimeter may output a voltage or other signal indicative of the power of beam 26 to control module 215 or another suitable control module, such as control module 12 of exposure system 10. Control module 215 may then use signal output by power meter 213 to calibrate digital camera 64, the power meter of power control 40, or power meter 212 in a similar calibration routine to the routine described above with reference to power meter 212.

Chuck mounted PSD 214 may calibrate the modules responsible for the positioning of beam 26, including PSD 62 of each of the first and second beam monitors 34, 42, and first and second galvanometers 50, 52. As described above, the position of beam 26 in the x-y axes of image plane 14 may be correlated to positions of first and second galvanometers 50, 52. Additionally, the galvanometers 50, 52 may be controlled based on a location signal output by PSD 62 in each of the first and second beam monitors 34, 42. Thus, it is important to have an accurate calibration between the position sensed by PSD 62 in each of the first and second beam monitors 34, 42, the position of the first and second galvanometers 50, 52, and the actual location of beam 26 at the image plane 14, as measured by chuck mounted PSD 214. As such, control module 215, or another suitable control module, such as control module 12 of exposure system 10, may utilize the location signal output by chuck mounted PSD 213 to calibrate the PSD 62 of each of the first and second beam monitors 34, 42 and first and second galvanometers 50, 52. For example, PSD 213 may detect the position of beam 26 and output a location signal including two coordinate values (e.g., an x-axis coordinate value and a y-axis coordinate value, or a radial coordinate value and an angular coordinate value (in a polar coordinate system)). Control module 215 may compare these coordinate values to the coordinate values indicated by PSD 62 of each of the first and second beam monitors 34, 42, and the coordinate values input to first and second galvanometers 50, 52, which may or may not be the same. The difference between these coordinate values, if any, may indicate a calibration error, which the control module 215 may correct by updating the coordinate values of PSD 62 and/or galvanometers 50, 52 to match those of PSD 213. This process may be repeated for a plurality of coordinate values measured by PSD 213 to produce a more accurate calibration of PSD 62 of each of the first and second beam monitors 34, 42, first and second galvanometers 50, 52, and the actual position of beam 26 in the x-y plane of the image plane 14 as measured by the chuck mounted PSD 213.

Each of the power and position calibration routines may be repeated periodically throughout the manufacture of an article, or at times between manufacture of articles, to help ensure the stability of exposure system 10 and fidelity of the manufactured articles to the desired articles.

Control module 12, or any other suitable control module, may include software and/or hardware that enable control of exposure system 10 and the various optical modules to accurately generate the desired features for the finished article. The software and/or hardware may include a number of control system levels to manage various levels of exposure system 10. For example, the software and/or hardware may include a feature control system, a supervisory control system, and a high speed higher level control system.

The feature control system includes a high speed integrated control system to control the exposure of resin 22 to beam 26. The feature control system may control exposure control module 82, optical scanning module 110 and interface with the first and second beam monitors 34, 42, position detector 46, and system calibration module 210 to provide coordinated position and exposure control in the x-, y-, and z-axes. The feature control system may collect actual beam 26 position and desired beam 26 position data for all three axes, and may control the responsible optical modules to move beam 26 into the desired position.

The high speed higher level control system interfaces with all modules of exposure system 10 and provide overall supervision of article generation, optical diagnostics, and system sequencing.

The environment within which the system is operated may limit the performance of exposure system 10. For example, variations in temperature, humidity and electrical power, along with vibration and particulate contamination, may be detrimental to the process of manufacturing articles using exposure system 10. Thus, it may be desirable to control the environment in and around exposure system 10. One or more of temperature, humidity, and particulate content may be controlled in and around the exposure system 10. For example, the system 10 may be housed in a clean room that provides a Class 1000 or better clean environment. The surrounding environment may also include temperature control to limit the range of temperatures system 10 experiences. For example, in some preferred embodiments, temperature control of better that +/−0.1° C. may be provided. Humidity may also affect the ability of exposure system 10 to create articles with high fidelity to the desired article. In some embodiments, control of better than +/−10% relative humidity may be provided to reduce or substantially eliminate the influence of humidity fluctuations on system 10 and article produced thereby.

Unexpected or undesired interruptions in the supply of power to exposure system may result in wasted articles due to imperfections caused by the abrupt and uncontrolled shutdown of exposure system 10. For example, if the galvanometers 50, 52 or high speed shutter 44 are shut down before light source 32, a volume of resin 22 may be cured that is not desired to be cured. Thus, in some embodiments, the system 10 may be connected to an Uninterruptible Power Supply (UPS) such that in the event of a building power failure, the system 10 will transfer to battery power long enough to finish at least the current feature being written (but possibly not the whole article) and go into a soft shutdown that prevents the exposure of undesired volumes of resin 22. In some preferred embodiments, the soft shutdown can be restarted after power is restored without detrimental effects to the part being fabricated.

Various embodiments of the invention have been described. These and other embodiments are within the scope of the following claims.

What is claimed is:

1. An exposure system comprising:
a light source emitting a beam along an optical axis, wherein the beam is capable of inducing a multi-photon reaction in a resin;
a resin undergoing multiphoton reaction; and
an automated system that monitors a voxel shape within the resin, generates a signal indicative of the voxel shape, and adjusts the beam in response to the signal,
wherein the beam induces polymerization in the resin by a two-photon absorption process.

2. An exposure system comprising:
a light source emitting a beam along an optical axis, wherein the beam is capable of inducing a multi-photon reaction in a resin;
a resin undergoing multiphoton reaction; and
an automated system comprising:
means for monitoring a voxel shape within the resin, and
means for adjusting the beam in response to a signal from the means for monitoring,
wherein the beam induces polymerization in the resin by a two-photon absorption process.

* * * * *